(12) United States Patent
Takaiwa

(10) Patent No.: US 8,749,755 B2
(45) Date of Patent: Jun. 10, 2014

(54) STAGE APPARATUS AND EXPOSURE APPARATUS

(75) Inventor: Hiroaki Takaiwa, Kumagaya (JP)

(73) Assignee: Nikon Corporation, Tokyo (JP)

(*) Notice: Subject to any disclaimer, the term of this patent is extended or adjusted under 35 U.S.C. 154(b) by 174 days.

(21) Appl. No.: 13/067,363

(22) Filed: May 26, 2011

(65) Prior Publication Data

US 2011/0228240 A1    Sep. 22, 2011

Related U.S. Application Data

(62) Division of application No. 11/783,994, filed on Apr. 13, 2007, now Pat. No. 7,973,910.

(60) Provisional application No. 60/859,490, filed on Nov. 17, 2006.

(51) Int. Cl.
 *G03B 27/42* (2006.01)
 *G03B 27/52* (2006.01)
 *G03B 27/58* (2006.01)
 *G03F 7/20* (2006.01)

(52) U.S. Cl.
 CPC ........ *G03F 7/70341* (2013.01); *G03F 7/70716* (2013.01)
 USPC ............... 355/30; 310/12.06; 355/53; 355/72

(58) Field of Classification Search
 CPC ............ G03F 7/70341; G03F 7/70716; G03F 7/70733
 USPC ......... 310/12.05–12.06; 318/649; 355/30, 53, 355/72, 77
 See application file for complete search history.

(56) References Cited

U.S. PATENT DOCUMENTS

| | | | |
|---|---|---|---|
| 4,346,164 A | 8/1982 | Tabarelli et al. |
| 4,480,910 A | 11/1984 | Takanashi et al. |
| 5,528,118 A | 6/1996 | Lee |
| 5,610,683 A | 3/1997 | Takahashi |
| 5,623,853 A | 4/1997 | Novak et al. |
| 5,715,039 A | 2/1998 | Fukuda et al. |
| 5,825,043 A | 10/1998 | Suwa |
| 5,874,820 A | 2/1999 | Lee |

(Continued)

FOREIGN PATENT DOCUMENTS

| | | |
|---|---|---|
| DE | 221 563 A1 | 4/1985 |
| DE | 224 448 A1 | 7/1985 |

(Continued)

OTHER PUBLICATIONS

Office Action issued in U.S. Appl. No. 11/783,994 on May 27, 2009.

(Continued)

*Primary Examiner* — Toan Ton
*Assistant Examiner* — Colin Kreutzer
(74) *Attorney, Agent, or Firm* — Oliff PLC

(57) ABSTRACT

A stage apparatus includes: a moving stage, which moves along a movement plane; a first moving table, which holds a specimen while being able to move with respect to the moving stage; and a second moving table, which is provided on the moving stage and, when the first moving table has moved from a first position to a second position, is positioned at the first position.

18 Claims, 14 Drawing Sheets

(56) References Cited

U.S. PATENT DOCUMENTS

| | | | |
|---|---|---|---|
| 6,879,378 B2 | 4/2005 | Morita et al. | |
| 7,119,876 B2 | 10/2006 | Van Der Toorn et al. | |
| 2004/0165159 A1 | 8/2004 | Lof et al. | |
| 2004/0263809 A1 | 12/2004 | Nakano | |
| 2005/0002004 A1 | 1/2005 | Kolesnychenko et al. | |
| 2005/0117134 A1 | 6/2005 | Nagasaka et al. | |
| 2005/0237504 A1 | 10/2005 | Nagasaka et al. | |
| 2006/0023186 A1* | 2/2006 | Binnard | 355/53 |
| 2006/0082741 A1* | 4/2006 | Van Der Toorn et al. | 355/30 |
| 2006/0187431 A1 | 8/2006 | Shibazaki | |
| 2007/0115450 A1 | 5/2007 | Nagasaka et al. | |
| 2007/0127006 A1 | 6/2007 | Shibazaki | |
| 2007/0216881 A1 | 9/2007 | Van Der Schoot et al. | |
| 2007/0242242 A1 | 10/2007 | Nagasaka et al. | |
| 2008/0068571 A1* | 3/2008 | Kiuchi | 355/53 |

FOREIGN PATENT DOCUMENTS

| | | |
|---|---|---|
| EP | 1 494 267 A1 | 1/2005 |
| EP | 1 655 765 A1 | 5/2006 |
| EP | 1 713 113 A1 | 10/2006 |
| EP | 1 699 072 A1 | 9/2009 |
| JP | A 58-202448 | 11/1983 |
| JP | A 59-19912 | 2/1984 |
| JP | A 62-65326 | 3/1987 |
| JP | A 63-157419 | 6/1988 |
| JP | A 4-305915 | 10/1992 |
| JP | A 4-305917 | 10/1992 |
| JP | A 5-62877 | 3/1993 |
| JP | A 6-53120 | 2/1994 |
| JP | A 6-124873 | 5/1994 |
| JP | A 6-188169 | 7/1994 |
| JP | A 7-220990 | 8/1995 |
| JP | A 8-166475 | 6/1996 |
| JP | A 8-316125 | 11/1996 |
| JP | A 8-330224 | 12/1996 |
| JP | 10-154659 | 6/1998 |
| JP | A 10-214783 | 8/1998 |
| JP | A 10-303114 | 11/1998 |
| JP | A 10-340846 | 12/1998 |
| JP | A 11-176727 | 7/1999 |
| JP | A 2000-58436 | 2/2000 |
| JP | 2004-207711 | 7/2004 |
| JP | 2005-019864 | 1/2005 |
| WO | WO 99/49504 A1 | 9/1999 |
| WO | WO 03/085708 | 10/2003 |
| WO | WO 2004/019128 A2 | 3/2004 |
| WO | WO 2004/090577 A2 | 10/2004 |
| WO | WO 2005/015615 | 2/2005 |
| WO | WO 2005/055296 A1 | 6/2005 |
| WO | WO 2005/074014 | 8/2005 |

OTHER PUBLICATIONS

Office Action issued in U.S. Appl. No. 11/783,994 Apr. 8, 2010.
Office Action issued in U.S. Appl. No. 11/783,994 on Sep. 28, 2010.
Notice of Allowance issued in U.S. Appl. No. 11/783,994 on Apr. 8, 2011.
Aug. 21, 2012 Office Action issued in JP Application No. 2010-140591 (with English translation).
Office Action issued in JP Application No. 2004-286889 on Oct. 5, 2010.
Office Action issued in JP Application No. 2004-286889 on Apr. 20, 2010.

* cited by examiner

STAGE APPARATUS AND EXPOSURE APPARATUS

CROSS-REFERENCE TO RELATED APPLICATION

This is a division of Application Ser. No. 11/783,994, filed Apr. 13, 2011, which claims the benefit of U.S. Provisional Application No. 60/859,490, filed Nov. 17, 2006. The disclosure of the prior application[s] is hereby incorporated by reference herein in its entirety.

BACKGROUND OF THE INVENTION

1. Field of the Invention

The present invention relates to a stage apparatus and an exposure apparatus; for example, it relates to a stage apparatus and an exposure apparatus that are optimal for use when performing so-called liquid immersion exposure, in which a liquid is supplied onto a substrate to perform exposure.

2. Description of Related Art

Semiconductor devices and liquid crystal display devices are manufactured by a so-called photolithography technique that transfers a pattern formed on a mask onto a photosensitive substrate.

The exposure apparatus used in this photolithography process has a mask stage that supports a mask and a substrate stage that supports a substrate, and it transfers the pattern of the mask to the substrate via a projection optical system while sequentially moving the mask stage and the substrate stage. In recent years, higher resolutions for projection optical systems have been in demand to handle the even higher integration of device patterns. The resolution of the projection optical system is higher the shorter the exposure wavelength used and the larger the numerical aperture of the projection optical system. For this reason, the exposure wavelength used in exposure apparatuses has become shorter year by year, and the numerical aperture of the projection optical system is also increasing. In addition, the mainstream exposure wavelength at present is the 248 nm of a KrF excimer laser, but a shorter wavelength, the 193 nm of an ArF excimer laser, is also coming into practical application. In addition, when exposure is performed, the depth of focus (DOF) is also important in the same way as the resolution. The resolution R and the depth of focus $\delta$ are expressed by the respective equations below.

$$R = k_1 \cdot \lambda / NA \quad (1)$$

$$\delta = \pm k_2 \cdot \lambda / NA^2 \quad (2)$$

Here, $\lambda$ is the exposure wavelength, NA is the numerical aperture of the projection optical system, and $k_1$ and $k_2$ are process coefficients. Based on Equation (1) and Equation (2), it is apparent that when the exposure wavelength $\lambda$ is made shorter to increase the numerical aperture NA in order to increase the resolution R, the depth of focus $\delta$ becomes narrower.

At such times, when the depth of focus $\delta$ is too narrow, it is difficult to match the substrate surface to the image plane of the projection optical system, and there is concern that the margin during the exposure operation will be insufficient.

Therefore, the liquid immersion method disclosed in PCT International Patent Publication No. WO 99/49504, for example, has been proposed as a method of essentially shortening the exposure wavelength and broadening the depth of focus. In this liquid immersion method, the space between the lower surface of the projection optical system and the substrate surface is filled with a liquid such as water or an organic solvent to form a liquid immersion region, and the fact that the wavelength of the exposure light in liquid becomes 1/n in air (n is normally approximately 1.2 to 1.6 at the refractive index of the liquid) is used to increase the resolution while expanding the depth of focus to approximately n times.

In the conventional apparatus, when exchanging a substrate for which exposure processing has ended, it is necessary to move the substrate stage to the substrate exchange position (loading position). At this time, the substrate stage moves away from a position that opposes the projection optical system, so it is necessary to stop supply of the liquid while recovering the supplied liquid to avoid the liquid leaking out while recovering the supplied liquid. In addition, after substrate exchange, it is necessary to fill liquid between the projection optical system and the substrate stage, so there are problems in that there is a great loss of time, and throughput drops.

In addition, drying is performed through recovery of the liquid, so there is a problem in that water marks are produced on the projection optical system, and there is a problem in that temperature changes occur in the projection lens, the liquid supply nozzle, etc. due to heat of vaporization.

Therefore, it is thought that even when the substrate stage has been moved to the loading position, the substrate stage (or a liquid immersion region forming member provided on the substrate stage) is made larger so that a liquid immersion region continues to be formed in the space with respect to the projection optical system, but in this case, a problem occurs in that this leads to an increase in the weight of the substrate stage, and throughput drops. In addition, since it becomes necessary to increase the distance between an interferometer, which is provided to obtain substrate position information, and the movable mirror, this leads to the problems of a larger apparatus and a reduction in measurement accuracy.

These problems are not limited to when the substrate stage moves to the loading position, and, as shown in Japanese Unexamined Patent Application Publication No. H10-214783, it occurs in the same way during stage exchange in a twin stage type stage apparatus in which substrate stages are plurally exchangeably provided.

A purpose of some aspects of the invention is to provide a stage apparatus and an exposure apparatus that make possible stage movement without causing throughput to decrease.

SUMMARY OF THE INVENTION

According to a first aspect of the present invention, there is provided a stage apparatus comprising: a moving stage, which moves along a movement plane; a first moving table, which is able to move with respect to the moving stage; and a second moving table, which is provided on the moving stage and, when the first moving table has moved from a first position to a second position, is positioned at the first position.

Therefore, in the stage apparatus, even in the case where, after the desired process (for example, the liquid supply process) has been performed using the first moving table at the first position, the first moving table has been moved to the second position in conjunction with the movement of the moving stage or with respect to the moving stage, it is possible to continue to perform the desired process using the second moving table positioned at the first position. For this reason, even when the first moving table has moved to the second position, there is no longer a need to stop the desired process, for example, the liquid supply process, and it becomes possible to prevent a drop in throughput.

According to a second aspect of the present invention, there is provided a stage apparatus comprising a first moving table, which is able to move along a movement plane; a first moving apparatus, which moves the first moving table; a second moving apparatus, which moves the first moving table using a movement stroke that is larger than the movement stroke resulting from the first moving apparatus of the first moving table; and a second moving table, which is provided on the second moving apparatus and, when the first moving table has moved from a first position to a second position, moves to the first position.

Therefore, in the stage apparatus, even in the case where, after the desired process (for example, the liquid supply process) has been performed using a first moving table at the first position, the first moving table has moved to the second position by means of the driving of the first moving apparatus or the second moving apparatus, it is possible to continue to perform the desired process using the second moving table positioned at the first position. For this reason, there is no longer a need to stop the desired process, for example, the liquid supply process, even when the first moving table has moved to the second position, and it becomes possible to prevent a drop in throughput.

According to a third aspect of the present invention, there is provided an exposure apparatus, comprising: a stage apparatus described above; and a projection optical system via which a substrate held by the stage apparatus is exposed with a pattern image.

Therefore, in the exposure apparatus of the present invention, even in the case where, after the pattern has been exposed while performing the desired process (for example, the liquid supply process) on the substrate held on the first moving table at the first position, the first moving table has moved to the second position, it is possible to continue to perform the desired process using the second moving table positioned at the first position. For this reason, there is no longer a need to stop the desired process, for example, the liquid supply process, even when the first moving table has moved to the second position, and it becomes possible to prevent a drop in throughput.

In the some aspects of the present invention, even when the first moving table has moved to the second position, by using the second moving table, there is no longer a need to stop the desired process, and it becomes possible to prevent a drop in throughput.

DESCRIPTION OF THE PREFERRED EMBODIMENTS

Hereunder, embodiments of the stage apparatus and the exposure apparatus of the present invention will be explained while referring to FIG. 1 to FIG. 16.

In the present embodiment, the case in which a scanning type exposure apparatus (a so-called scanning stepper) that exposes a pattern formed on a mask M while synchronously moving the mask M and the substrate (specimen) P in mutually different directions (opposite directions) in the scanning direction is used as the exposure apparatus EX will be explained as an example. In the following explanation, the direction that matches the optical axis AX of the projection optical system PL is the Z axis direction, the synchronous movement direction (scanning direction) of the mask M and the substrate P within a horizontal plane perpendicular to the Z axis direction is the X axis direction, and the direction perpendicular to the Z axis direction and the X axis direction (non-scanning direction) is the Y axis direction. In addition, the directions of rotation (inclination) about the X axis, the Y axis and the Z axis are considered to be the θX, θY and θZ directions respectively. Note that, here, "substrate" includes those in which a photoresist, which is a photosensitive material, has been coated onto a semiconductor wafer, and "mask" includes reticles in which a reduction projected device pattern has been formed on a substrate.

In addition, in this exposure apparatus EX, the stage apparatus of the present invention will be explained as one that is applied to a substrate stage.

First Embodiment

Figure 1:
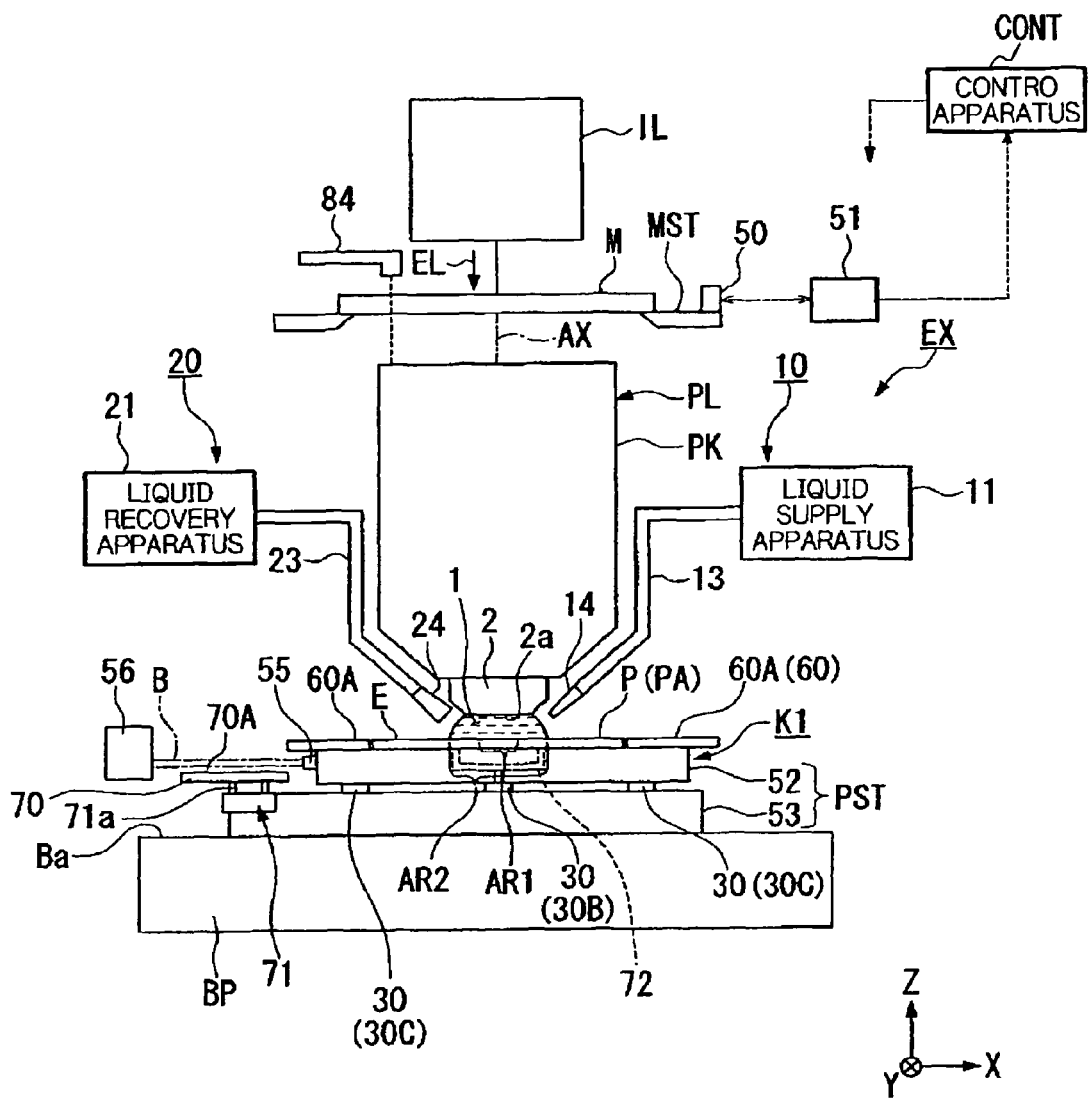
FIG. 1 is a drawing that shows an embodiment of the present invention and is a schematic block diagram that shows an embodiment of an exposure apparatus.

In FIG. 1, the exposure apparatus EX of the present embodiment comprises a mask stage MST that supports a mask M, an illumination optical system IL that uses exposure light EL to illuminate the mask M that is supported by the mask stage MST, and a projection optical system PL that projection exposes the pattern image of the mask M illuminated by the exposure light EL onto the substrate P supported on a substrate stage PST that is the stage apparatus, and the operation of the entire exposure apparatus EX is comprehensively controlled by a control apparatus CONT.

The exposure apparatus EX of the present embodiment is a liquid immersion exposure apparatus that has applied the liquid immersion method to effectively shorten the exposure wavelength to improve resolution as it effectively broadens the depth of focus, and it comprises a liquid supply mechanism (liquid supply apparatus) 10 that supplies a liquid 1 onto the substrate P and a liquid recovery mechanism 20 that recovers the liquid 1 on the substrate P. The exposure apparatus EX (locally) forms a liquid immersion region (first position) AR2 on a portion of the substrate P that includes the projection region AR1 of the projection optical system PL using a liquid 1 supplied from a liquid supply mechanism 10 at least while the pattern image of the mask M is being transferred onto the substrate P. Specifically, the exposure apparatus EX employs a local liquid immersion system that fills in a liquid 1 between the optical element 2 at the terminating end portion of the image plane side of the projection optical system PL and the substrate P surface arranged on that image plane side and projection exposes the pattern of the mask M onto the substrate P by irradiating with exposure light EL that has passed through a mask M onto the substrate P via the projection optical system PL and the liquid 1 between this projection optical system PL and the substrate P.

The illumination optical system IL uses exposure light EL to illuminate a mask M that is supported on the mask stage MST, and it has an exposure light source, an optical integrator that evens out the illumination intensity of the luminous flux that has emerged from the exposure light source, a condenser lens that focuses the exposure light EL from the optical integrator, a relay lens system, and a variable field diaphragm that sets the illumination region on the mask M resulting from the exposure light EL in a slit shape. The prescribed illumination region on the mask M is illuminated by exposure light EL with a uniform illumination intensity distribution by means of the illumination optical system IL. Used as the exposure light EL that has emerged from the illumination optical system IL are, for example, deep ultraviolet light (DUV light) such as ultraviolet band bright lines (g-rays, h-rays, i-rays) that have emerged from a mercury lamp and KrF excimer laser light (wavelength of 248 nm) or vacuum ultraviolet light (VUV light) such as ArF excimer laser light (wavelength of 193 nm) and $F_2$ laser light (wavelength of 157 nm). In the present embodiment, ArF excimer laser light is used.

The mask stage MST supports a mask M, and it is capable of two-dimensional movement within a plane perpendicular to the optical axis AX of the projection optical system PL, that is, within the XY plane, and it is capable of microrotation in the $\theta Z$ direction. The mask stage MST is driven by a mask stage drive apparatus such as a linear motor. The mask stage drive apparatus is controlled by a control apparatus CONT. A movable mirror 50 is provided on the mask stage MST. In addition, an XY interferometer 51 comprising a laser interferometer is provided at a position that opposes the movable mirror 50. The position of the mask M on the mask stage MST in the two-dimensional direction and the rotation angle are measured in real time by an XY interferometer 51, and the measurement results are output to the control apparatus CONT. The control apparatus CONT performs positioning of the mask M that is supported on the mask stage MST by driving the mask stage drive apparatus based on the measurement results of the XY interferometer 51.

The projection optical system PL projection exposes the pattern of the mask M onto a substrate P at a prescribed projection magnification $\beta$, and it comprises a plurality of optical elements that include an optical element (lens) 2 provided at the terminating end portion on the substrate P side (image plane side of the projection optical system PL), and these optical elements are supported by a lens barrel PK. In the present embodiment, the projection optical system PL is a reduction inverted image system in which the projection magnification $\beta$ is ¼ or ⅕, for example. Note that the projection optical system PL may be either a magnification system or an enlargement system and may be either an inverted image system or an erect image system. In the case where the projection optical system PL is an erect image system, scanning of the mask M and the substrate P are performed in the same direction. In addition, the optical element (lens) 2 of the front end portion of the projection optical system PL of the present embodiment is provided so that it can be attached to or removed from (replaced) the lens barrel PK, and the liquid 1 of the liquid immersion region AR2 comes into contact with the optical element 2.

In the present embodiment, pure water is used as the liquid 1. Pure water is able to transmit not only ArF excimer laser light but deep ultraviolet light (DUV light) such as ultraviolet band bright lines (g-rays, h-rays, i-rays) that have emerged from a mercury lamp and KrF excimer laser light (wavelength of 248 nm). Note that, in the present embodiment, the numerical aperture of a projection optical system that has employed pure water for liquid immersion exposure is set to 1 or higher (approximately 1.0 to 1.2).

The optical element 2 is formed of fluorite. The fluorite surface or a surface to which $MgF_2$, $Al_2O_3$, $SiO_2$, etc. has been adhered has a high affinity with water, so it is possible to cause the liquid 1 to closely adhere to nearly the entire surface of the liquid contact surface $2a$ of the optical element 2. Specifically, in the present embodiment, a liquid (water) 1 that has a high affinity with the liquid contact surface $2a$ of the optical element 2 is supplied, so the adherence between the liquid contact surface $2a$ of the optical element 2 and the liquid 1 is high, and it is possible to reliably fill the optical path between the optical element 2 and the substrate P with the liquid 1. Note that the optical element 2 may also be quartz that has a high affinity with water. In addition, hydrophilic (lyophilic) treatment may be performed on the liquid contact surface $2a$ of the optical element 2 to further increase the affinity with the liquid 1.

A substrate stage PST that holds a substrate P and is able to move will be explained below.

The substrate stage PST comprises a substrate table (first moving table) 52, which holds a substrate P and is able to move, and an XY stage (moving stage) 53, which supports the substrate table 52 and moves in the XY direction along a movement plane Ba on a base (base plate) BP.

The substrate stage PST is driven by a substrate stage drive apparatus such as a linear motor. The substrate stage drive apparatus is controlled by a control apparatus CONT. The substrate table 52 is provided on the XY stage 53 via a plurality of (here, three) actuators 30 (30A to 30C) formed by, for example, piezoelectric elements or voice coil motors (VCM). The actuators 30A to 30C move the substrate table 52 in parallel slightly in the Z axis direction overall with respect to the XY stage 53 based on drive signals from the control apparatus CONT while the position of substrate P held on the substrate table 52 in the Z axis direction (focus position) and the positions in the $\theta X$ and $\theta Y$ directions are controlled by causing slight inclination in the $\theta X$ direction and the $\theta Y$ direction.

Specifically, the substrate table 52 controls the focus position and inclination angle of the substrate P to focus the surface of the substrate P on the image plane of the projection optical system PL using an autofocus system or an autoleveling system, and the XY stage 53 performs positioning (X, Y and $\theta Z$ directions) within the XY plane of the substrate P. Note that it is of course permissible to provide the substrate table 52 and the XY stage 53 as a unit.

In addition, a plurality of pin members (not shown in the drawing) are provided on the upper surface (support surface) of the substrate table 52, and vacuum suction holes connected to a vacuum system are provided among the plurality of pin members. Specifically, the substrate table has a so-called pin chuck mechanism, and it performs vacuum suction holding in a status in which the rear surface of the substrate P is supported by the pin members.

Figure 2:
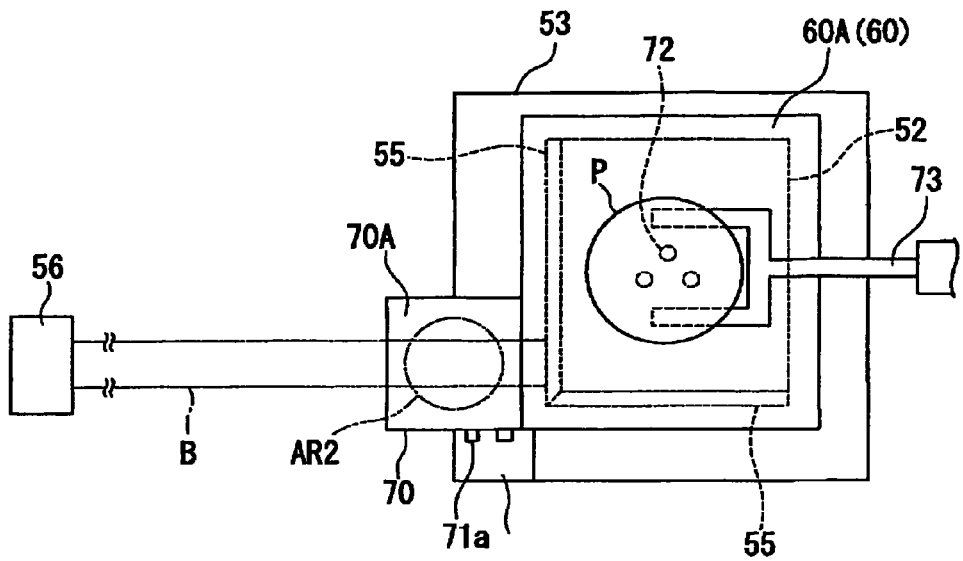
FIG. 2 is a schematic plan view of the substrate table that comprises the exposure apparatus.

In addition, lift pins 72 that perform raising and lowering (lifting) in the Z axis direction while suction holding the substrate are provided on the substrate table 52. The lift pins 72 have a configuration such that they suction hold the substrate P at a plurality of locations (here, three locations) as shown in FIG. 2.

Furthermore, by canceling suction holding of the substrate P to the substrate table 52 while suction holding the substrate P and raising the lift pins 72, the substrate P is caused to separate from the substrate table 52, and it is possible to transfer the substrate P to a wafer loader 73.

Note that, in actuality, a substrate holder is provided on the substrate table 52, and the substrate P is suction held by the substrate holder, but one in which the substrate table 52 includes the substrate holder will be explained here.

An XY movable mirror 55 is provided on the side surface (in FIG. 1, the side surface of the −X side) of the substrate stage PST (substrate table 52). In addition, an XY interferometer (position detection apparatus) 56 comprising a laser interferometer that directs a measuring beam (beam) B to the XY movable mirror 55 is provided at a position that opposes the XY movable mirror 55. The position information of the substrate stage PST (and, in turn, a substrate table 52 and the substrate P) in the two-dimensional direction and the rotation angle (position information relating to the X, Y and θZ directions) is measured in real time by an XY interferometer 56 using the reflected light of the measuring beam B from the XY movable mirror 55, and the measurement results are output to the control apparatus CONT. The control apparatus CONT performs positioning of the substrate stage P that holds the substrate P by driving the substrate stage drive apparatus based on the measurement results of the XY interferometer 56.

A plate member 60 is provided on the substrate stage PST (substrate table 52) so that it surrounds the substrate P held on the substrate stage PST. The plate member 60 is formed so that it extends from substrate table 52 to outside the substrate P. The plate member 60 has a flat surface (flat part) 60A that is nearly the same height (flush) as the surface of the substrate P held on the substrate stage PST.

The plate member 60 is formed of a material that has liquid repellency, such as polytetrafluoroethylene (Teflon®). For this reason, the flat surface 60A has liquid repellency. Note that the plate member 60 is formed, for example, of a prescribed metal, and the flat surface 60A may be made liquid repellent by performing liquid repellence treatment on at least the flat surface 60A of that plate member 60 made of metal. For the liquid repellence treatment of the plate member 60 (flat surface 60A), for example, a fluorine resin material such as polytetrafluoroethylene or a liquid repellent material such as an acrylic resin material is coated, or a thin film consisting of that liquid repellent material is applied. A material that is insoluble with respect to the liquid 1 is used for the liquid repellent material for providing liquid repellency. In addition, for the coating region of the liquid repellent material, coating may be performed with respect to the entire surface of the plate member 60, or coating may be performed with respect to only a partial region that requires liquid repellency, such as the flat surface 60A.

A plate member 60, which has a flat surface 60A that is nearly flush with the substrate P surface is provided in the vicinity of the substrate P, so even when liquid immersion exposure of the edge region E of the substrate P is performed, the liquid 1 can be held below the projection optical system PL, and the liquid immersion region AR2 can be formed well on the image plane side of the projection optical system PL. In addition, by making the flat surface 60A liquid repellent, it is possible to restrict outflow of the liquid 1 outside the substrate P (outside the flat surface 60A) during liquid immersion exposure and smoothly recover the liquid 1 even after liquid immersion exposure so that the liquid 1 is prevented from remaining on the flat surface 60A for example.

In addition, in the present embodiment, when the substrate table 52 (plate member 60) has moved to a position that opposes the optical element 2 of the projection optical system PL and, more specifically, to a position that is separated from a first position that opposes the liquid immersion region AR2 (for example, the substrate P exchange position; the second position), a moving table (second moving table) 70, which moves in the Z direction so that it is positioned at a position that opposes the liquid immersion region AR2 is provided. The moving table 70 is formed of a material that has the same liquid repellency as the plate member 60, and it freely moves in the Z axis direction by means of the driving of a raising and lowering apparatus 71. The thickness of the moving table 70 is set to a size at which irradiation of the measuring beam B to the substrate table 52 can be maintained and position measurement can be continued even when the measuring beam B of the XY interferometer 56 is crossed during raising and lowering (for example, the thickness of the moving table 70 is approximately 2 mm when the beam diameter of the measuring beam B is approximately 8 mm).

The raising and lowering apparatus 71 is configured by an actuator comprising an air cylinder, a motor and a cam, and the configuration is such that, by a cylinder 71a connected to the moving table 70 extending in the Z direction under the control of the control apparatus CONT, raising and lowering of the moving table 70 are caused between a position at which the flat surface thereof (liquid repellent part) 70A is nearly flush with the flat surface 60A of the plate member 60 and aligns with the plate member 60 leaving a slight gap and a lay-by position that is below the measuring beam B (position shown in FIG. 1). This slight gap is set to approximately several μm to several mm, for example, and the liquid 1 is restricted from leaking out via the slight gap by means of the surface tension of the liquid 1.

Returning to FIG. 1, the liquid supply mechanism 10 is for supplying the prescribed liquid 1 onto the substrate P, and it comprises a liquid supply apparatus 11 that comprises a tank that accommodates the liquid 1, an acceleration pump, etc. and a supply pipe 13, one end portion of which connects to the liquid supply apparatus 11 and the other end portion of which connects to a supply nozzle 14. The supply nozzle 14 is arranged in proximity to the substrate P and supplies the liquid 1 from above the substrate P. The liquid 1 that is sent out from the liquid supply apparatus 11 and supplied onto the substrate P via the supply pipe 13 and the supply nozzle 14 forms a liquid immersion region AR2 by filling the space between the optical element 2 of the front end portion of the projection optical system PL and the substrate P.

The liquid recovery mechanism 20 is for recovering the liquid 1 on the substrate P, and it comprises a liquid recovery apparatus 21 comprising a vacuum system such as a vacuum pump, a gas-liquid separator, a tank that accommodates the recovered liquid 1, etc. and a recovery pipe 23, one end portion of which connects to the liquid recovery apparatus 21 and the other end portion of which connects to a recovery nozzle 24. The recovery nozzle 24 is arranged in proximity to the substrate P and is able to recover the liquid 1 on the substrate P. The liquid 1 on the substrate P is recovered by suction by the liquid recovery apparatus 21 via the recovery nozzle 24 and the recovery pipe 23 by driving the vacuum system of the liquid recovery apparatus 21.

When the liquid immersion region AR2 of the liquid 1 is formed on the substrate P, the control apparatus CONT drives the liquid supply apparatus 11 of the liquid supply mechanism 10 and supplies a prescribed amount of the liquid 1 per unit time onto the substrate P via the supply pipe 13 and the supply nozzle 14 as it drives the liquid recovery apparatus 21 of the liquid recovery mechanism 20 and recovers from on the substrate P a prescribed amount of the liquid 1 per unit time via the recovery nozzle 24 and the recovery pipe 23. Through this, the liquid 1 is arranged in the space between the optical element 2 of the front end portion of the projection optical system PL and the substrate P, and the liquid immersion region AR2 is formed.

Figure 3:
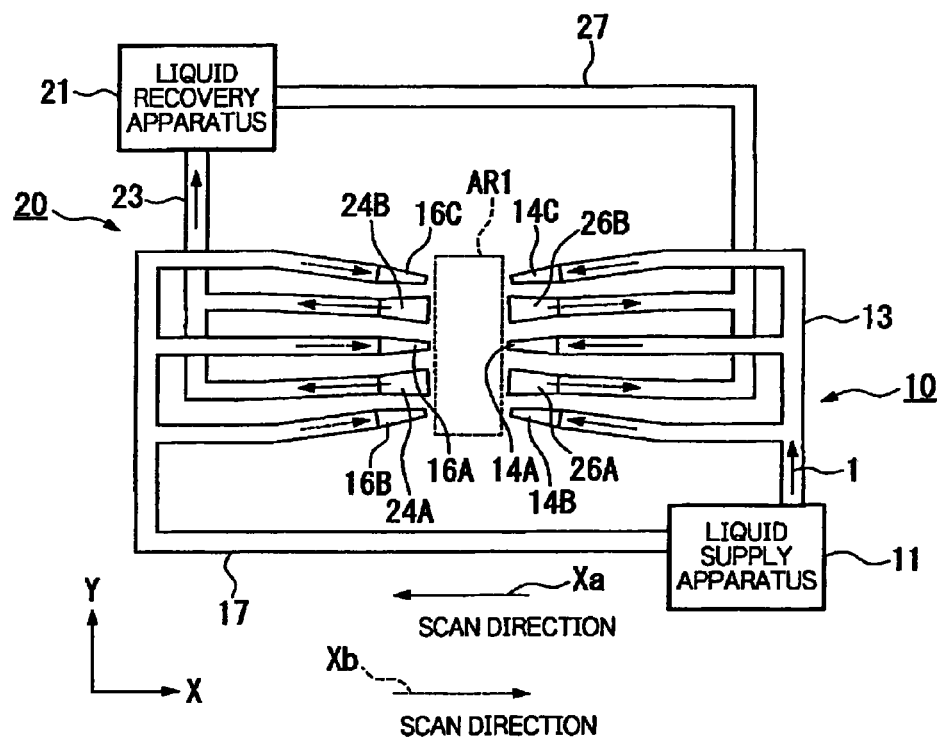
FIG. 3 is a schematic plan view that shows a liquid supply mechanism and a liquid recovery mechanism.

FIG. 3 is a plan view that shows the positional relationship between the liquid supply mechanism 10, the liquid recovery mechanism 20 and the projection region AR1 of the projection optical system PL. In FIG. 3, the projection region AR1 of the projection optical system PL is a long, narrow rectangular shape in the Y axis direction, and three supply nozzles 14A to 14C are arranged on the +X direction side and two recovery nozzles 24A, 24B are arranged on the −X direction side so as to interpose that projection region AR1 in the X axis direction. Also, supply nozzles 14A to 14C are connected to the liquid supply apparatus 11 via a supply pipe 13, and recovery nozzles 24A and 24B are connected to the liquid recovery apparatus 21 via a recovery pipe 23. In addition, supply nozzles 16A to 16C and recovery nozzles 26A and 26B are arranged in a positional relationship at which supply nozzles 14A to 14C and recovery nozzles 24A and 24B are rotated nearly 180° C. with respect to the center of the projection region AR1. Supply nozzles 14A to 14C and recovery nozzles 26A and 26B are alternately arrayed in the Y axis direction, supply nozzles 16A to 16C and recovery nozzles 24A and 24B are alternately arrayed in the Y axis direction, supply nozzles 16A to 16C are connected to the liquid supply apparatus 11 via a supply pipe 17, and recovery nozzles 26A and 26B are connected to the liquid recovery apparatus 21 via a recovery pipe 27.

Then, if the substrate P is moved in the scanning direction (−X direction) shown by arrow Xa to perform scanning exposure, supply pipe 13, supply nozzles 14 to 14C, recovery pipe 23, and recovery nozzles 24A and 24B are used, and liquid 1 supply and recovery are performed by the liquid supply apparatus 11 and the liquid recovery apparatus 21. Specifically, when the substrate P is moved in the −X direction, the liquid 1 is supplied in the space between the projection optical system PL and the substrate P via supply pipe 13 and supply nozzle 14 (14A to 14C) as the liquid 1 is recovered by the liquid recovery apparatus 21 via recovery nozzle 24 (24A, 24B) and recovery pipe 23, and the liquid 1 flows in the −X direction to fill the space between the optical element 2 of the image plane side of the projection optical system PL and the substrate P.

On the other hand, in the case where the substrate P is moved in the scanning direction (+X direction) shown by arrow Xb to perform scanning exposure, supply pipe 17, supply nozzles 16A to 16C, recovery nozzles 26A and 26B and recovery pipe 27 are used to perform liquid 1 supply and recovery by means of the liquid supply apparatus 11 and the liquid recovery apparatus 21. Specifically, when the substrate P moves in the +X direction, the liquid 1 is supplied in the space between the projection optical system PL and the substrate P from the liquid supply apparatus 11 via supply pipe 17 and supply nozzle 16 (16A to 16C) while the liquid 1 is recovered by the liquid recovery apparatus 21 via recovery nozzle 26 (26A, 26B) and recovery pipe 27, and the liquid 1 is caused to flow in the +X direction so that the space between optical element 2 of the image plane side of the projection optical system PL and the substrate P is filled.

In this way, the control apparatus CONT uses the liquid supply apparatus 11 and the liquid recovery apparatus 21 to cause the liquid 1 to flow in the same direction as the movement direction of the substrate P along the movement direction of the substrate P. In this case, the liquid 1 supplied from the liquid supply apparatus 11, for example, via supply nozzle 14 flows so that it is pulled into the space between optical element 2 of the projection optical system PL and the substrate P in conjunction with the movement of the substrate P in the −X direction, so the liquid 1 is easily supplied between the optical element 2 and the substrate P even if the supply energy of the liquid supply apparatus 11 is small. Also, by switching the direction in which the liquid 1 flows according to the scanning direction, even in the case where the substrate P is scanned in either the +X direction or the −X direction, it is possible to fill the space between the optical element 2 and the substrate P with the liquid 1, and it is possible to obtain high resolution and broad depth of focus.

Then, during scanning exposure, a portion of the pattern image of the mask M is projected to the projection region AR1 of the projection optical system PL, and the substrate P moves in the +X direction (or the −X direction) at a velocity β·V (β is the projection magnification) via the XY stage 53 in synchronization with the mask M moving in the −X direction (or the +X direction) at a velocity V with respect to the projection optical system PL. Then, after exposure to one shot region has ended, the next shot region moves to the scan start position by means of stepping of the substrate P, and exposure processing is thereafter sequentially performed on the respective shot regions by the step and scan method.

Note that the nozzle shape discussed above is not particularly the limited, and supply and recovery of the liquid 1 may also be performed using a pair of nozzles with respect to the long side of the projection region AR1 for example. Note that, in this case, it is possible to perform supply and recovery of the liquid 1 from either of the +X direction or the −X direction, so the supply nozzles and the recovery nozzles may be also arranged so that they are arrayed at the top and bottom. In addition, though not shown in the drawing, even in the case in which the nozzles that perform supply and recovery of the liquid 1 are provided at a prescribed interval around the optical element 2 of the projection optical system PL, and the substrate P moves in a direction other than the scanning direction (+X direction, −X direction), it is possible to cause the liquid 1 to flow in the same direction as the movement direction of the substrate P in parallel with the movement direction of the substrate P.

A photoresist (photosensitive material) is coated on a surface PA, which is the exposure surface of the substrate P. In the present embodiment, the photosensitive material is a photosensitive material for ArF excimer lasers (for example, TARF-P6100 made by Tokyo Ohka Kogyo Co., Ltd.), and it has liquid repellency (water repellency). In addition, in the present embodiment, the side surface of the substrate P is liquid repellence treated (water repellence treated). Specifically, the above photosensitive material, which has liquid repellency, is also coated on the side surface of the substrate P. In addition, the above photosensitive material is also coated on the rear surface of the substrate P to perform liquid repellence treatment.

Next, the exposure apparatus EX discussed above will be used to explain operations when the pattern of the mask M is liquid immersion exposed on the substrate P.

In exposing the pattern on the substrate P, the XY stage 53 is driven in advance to the exposure position (the position shown in FIG. 1, the first position) K1, at which the exposure region on the substrate P opposes the projection region AR1 within the liquid immersion region AR2.

Then, while the liquid 1 is supplied onto the substrate P by means of the liquid supply mechanism 10, the liquid 1 on the substrate P is recovered by means of the liquid recovery mechanism 20 to form a liquid immersion region AR2. Then, the control apparatus CONT irradiates exposure light EL to the substrate P via the projection optical system PL and the liquid 1 and moves the substrate stage PST (substrate table 52) that supports the substrate P while projecting the pattern image of the mask M onto the substrate P and performing liquid immersion exposure that exposes the substrate P.

At this time, the moving table 70 is at the lay-by position shown in FIG. 1 below the optical path of the measuring beam B, so there is no blocking of the measuring beam B, and therefore measurement of the position (or measurement of the velocity) of the substrate table 52 (substrate P) by the XY interferometer 56 is not obstructed.

Figure 4:
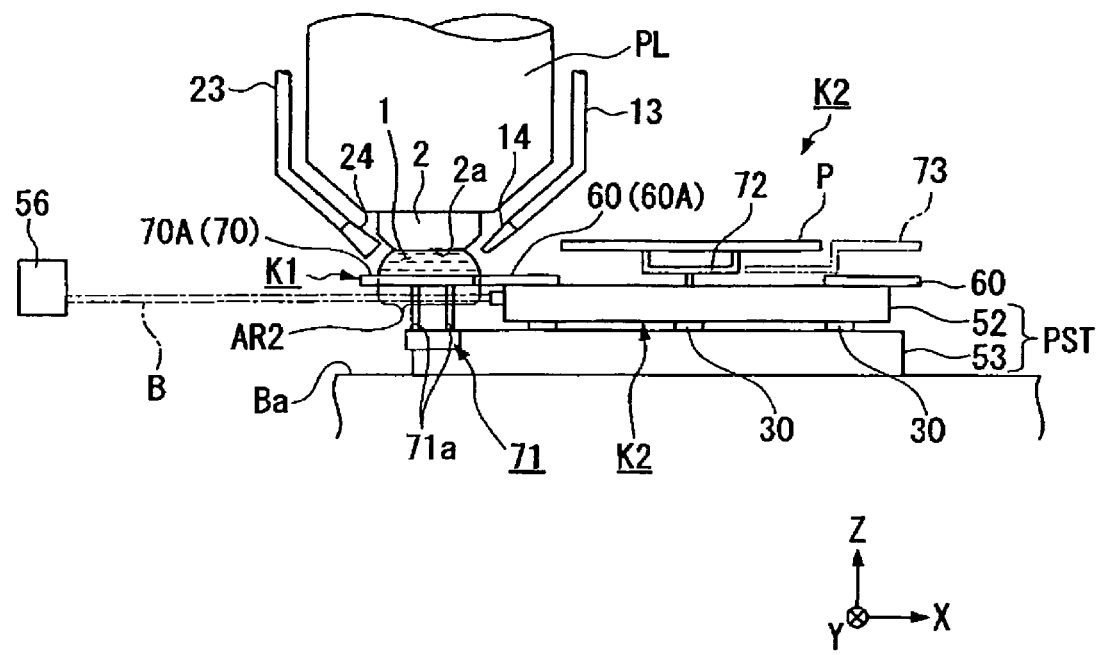
FIG. 4 is a drawing that shows the operations during substrate exchange.

On the other hand, when exposure processing with respect to the substrate P is ended and the substrate P is exchanged, after the completion of liquid immersion exposure, the control apparatus CONT, by driving the raising and lowering apparatus 71 and raising the cylinder 71a, as shown in FIG. 4, moves the moving table 70 to a height at which surface 70A comes to be approximately flush with surface 60A of the plate member 60 while moving the XY stage 53 to the substrate exchange position K2 (in FIG. 4, more to the +X side than the projection optical system PL), which is the second position.

During raising of this moving table 70, the moving table 70 crosses the measuring beam B of the XY interferometer 56, but the thickness of the moving table 70 is set to a size that does not obstruct position measurement by the XY interferometer 56 using a measuring beam B, so it is possible to continue without interrupting position measurement when the XY stage 53 (substrate table 52) moves to the substrate exchange position.

In addition, in conjunction with the XY stage 53 moving to the substrate exchange position, the liquid immersion region AR2 that was on the substrate P or on the plate member 60 moves away from on the plate member 60, and, as shown in FIG. 2, is positioned on surface 70A of the moving table 70. In other words, the moving table 70 is positioned at a position K1 that corresponds to the exposure position.

At this time, the liquid immersion region AR2 spans the gap between the plate member 60 and the moving table 70, but both surface 60A of the plate member 60 and surface 70A of the moving table 70 have liquid repellency, and this gap is set to a size that corresponds to the surface tension of the liquid 1, so the moving table 70 can be positioned in the liquid immersion region AR2 without the liquid 1 leaking out from the gap.

When the substrate stage PST is positioned at the substrate exchange position K2, the control apparatus CONT cancels suction holding of the substrate P to the substrate table 52 while raising the lift pins 72 in a status in which the substrate P has been held by suction to the lift pins 72 and causing the substrate P to separate from the substrate table 52. Then, a conveyance arm 73 moves into the space between substrate P raised by the lift pins 72 and the substrate table 52 and supports the lower surface of the substrate P (see FIG. 2 and FIG. 4). Then, the conveyance arm 73 unloads the substrate P from the substrate table 52 (substrate stage PST) while loading the substrate on which exposure processing is to be performed next onto the substrate table 52.

In this way, the substrate stage PST, for which substrate exchange at the substrate exchange position K2 has ended is again moved to the exposure position K1. Here, the control apparatus CONT moves the moving table 70 to the lay-by position shown in FIG. 1 by driving the raising and lowering apparatus 71 and lowering the cylinder 71a after the liquid immersion region AR2 has moved from on the moving table 70 onto the substrate table 52 (plate member 60 or the substrate) in conjunction with the movement of the substrate stage PST. Through this, it is possible to perform exposure processing without obstructing position measurement using the measuring beam B.

In this way, in the present embodiment, even when the moving table 52, which has a plate member 60, has moved from the exposure position K1 to the substrate exchange position K2, the moving table 70 is positioned at position K1, and the liquid immersion region AR2 can be maintained without the liquid 1 leaking out, so it is possible to perform substrate exchange without stopping the supply of liquid to the liquid immersion region AR2 or recovery of the liquid. For this reason, in the present embodiment, even in the case in which a sequence is included in which the substrate table 52 moves away from the exposure position, it is possible to reduce the standby time that accompanies liquid supply and recovery and improve throughput. Moreover, in the present embodiment, a liquid immersion region AR2 is always formed, so it is possible to avoid the problem of water marks occurring in the projection optical system PL and the problem of temperature changes occurring in the projection lens, the liquid supply nozzle, etc. due to heat of vaporization.

In addition, in the present embodiment, the surface 70A of the moving table 70 has liquid repellency, so even in the case in which the liquid immersion region AR2 has been positioned above the moving table 70, it is possible to maintain the liquid immersion region AR2 without the liquid 1 spreading and wetting. In addition, in the present embodiment, the moving table 70 and the plate member 60 are formed of the same material, so even in the case in which the liquid immersion region AR2 is formed to span the moving table 7.0 and the plate member 60, it is possible to prevent the liquid 1 inclining to the side at which liquid repellency is inferior due to differences in liquid repellency and causing the liquid immersion region AR2 to no longer be stably formed.

In addition, in the present embodiment, since the thickness of the moving table 70 is set to a size at which it is possible for position measurement by the XY interferometer 56 to continue based on the beam diameter of the measuring beam B, even if the measuring beam B is crossed during raising and lowering of the moving table 70, it is possible to perform stable exposure processing without interrupting position measurement and therefore without producing errors, etc. resulting from measurement not being possible.

Second Embodiment

Next, a second embodiment of the stage apparatus relating to the present invention will be explained while referring to FIG. 5 to FIG. 12.

Figure 5:
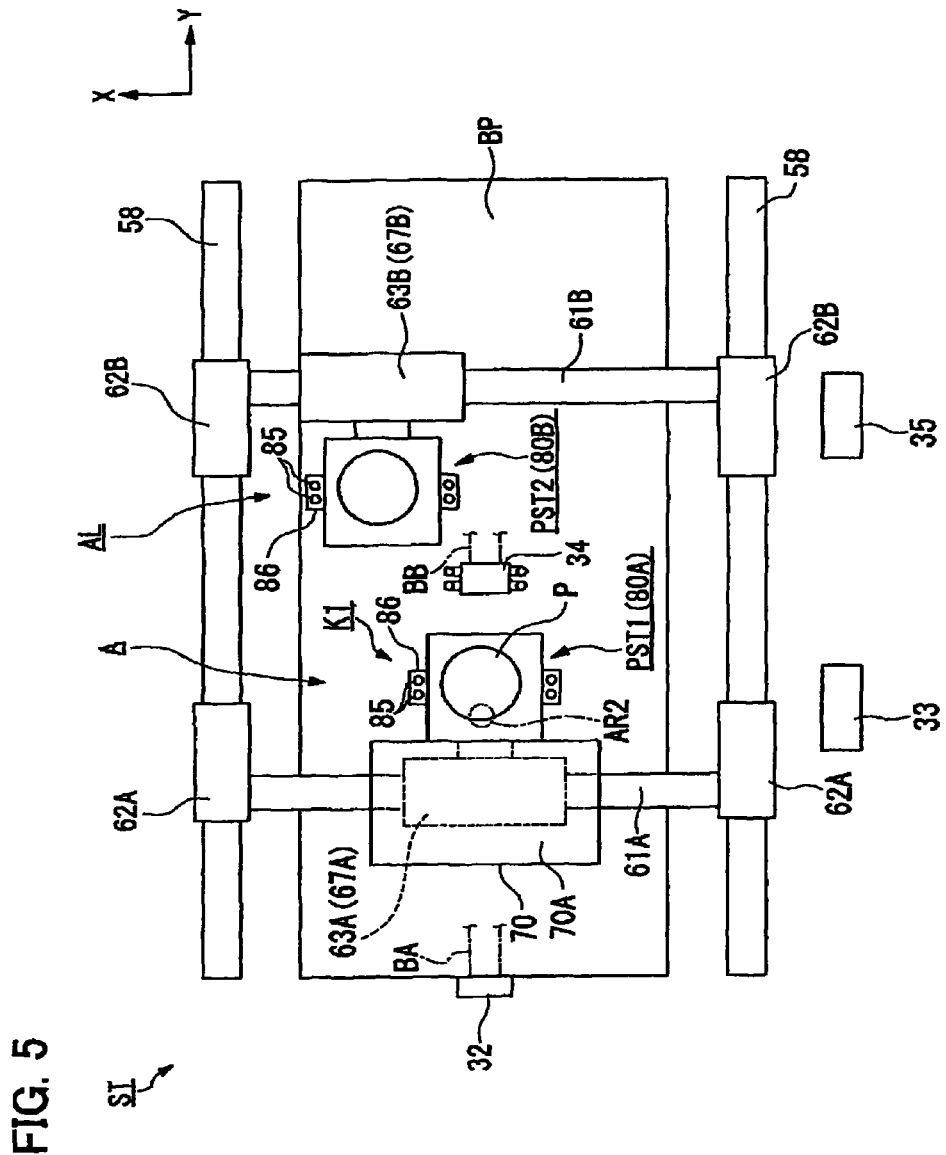
FIG. 5 is a plan view that schematically shows a stage apparatus of the second embodiment.

The stage apparatus ST in the present embodiment shown in FIG. 5 is a twin stage type apparatus, in which two stages that hold a substrate P have been mounted, and it comprises a first substrate stage PST1 and a second substrate stage PST2 which are able to respectively independently move on a common base BP. In addition, the twin stage type stage apparatus ST comprises an exposure area A (in FIG. 5, the left side), on which a liquid immersion region AR2 is arranged and which performs exposure processing on the substrate P, and a measuring area AL (in FIG. 5, the right side), in which measurement processing relating to the substrate stage PST1 (or PST2) that held the substrate P is performed. Due to the fact that the first substrate stage PST1 and the second substrate stage PST2 move, it is possible to exchange the first substrate stage PST1 and the second substrate stage PST2 between the exposure area A and the measuring area AL. Note that, in the measuring area AL, it is possible to perform loading and unloading of the substrate P with respect to the substrate stage PST1 (PST2). Specifically, exchange of the substrate P is performed in the measuring area AL.

A stage apparatus 12 comprises stators 58, 58, which are respectively arranged along the Y axis direction at the outside of both sides of the X axis direction of the base plate BP, movers 62A, 62A, which are connected to substrate stage PST1 via an X guide stage 61A and move substrate stage PST1 in the Y axis direction by moving along the stators 58, 58, movers 62B, 62B, which are connected to substrate stage PST2 via an X guide stage 61B and move substrate stage PST2 in the Y axis direction by moving along stators 58, 58, the aforementioned X guide stage 61A, which is erected along the X direction between movers 62A, 62A, the aforementioned X guide stage 61B, which is erected in the X direction between movers 62B, 62B, an X coarse movement stage 63A, which is connected to substrate stage PST1 and moves along X guide stage 61A, and an X coarse movement stage 63B, which is connected to substrate stage PST2 and moves along X guide stage 61B.

A Y linear motor 65A is configured by stators 58 and movers 62A, and substrate stage PST1 moves in the Y axis direction by means of movers 62A driving by means of electromagnetic interaction with the stators 58. Similarly, a Y linear motor 65B is configured by stators 58 and movers 62B, and substrate stage PST2 moves in the Y axis direction by means of movers 62B driving by means of electromagnetic interaction with stators 58. Specifically, in the present embodiment, the configuration is such that stators 58 are jointly used in Y linear motors 65A and 65B.

In addition, stators (not shown in the drawing) are respectively embedded in X guide stages 61A and 61B along the X direction, and movers that are not shown in the drawing and move along the respective stators are respectively provided on X coarse movement stages 63A and 63B. X linear motors 67A, 67B are configured by these stators provided on the X guide stages 61A, 61B and movers provided on the X coarse movement stages 63A, 63B, and the substrate stages PST1, PST2 respectively move in the X axis direction due to the fact that the movers are driven by electromagnetic interaction with the stators.

Figure 6:
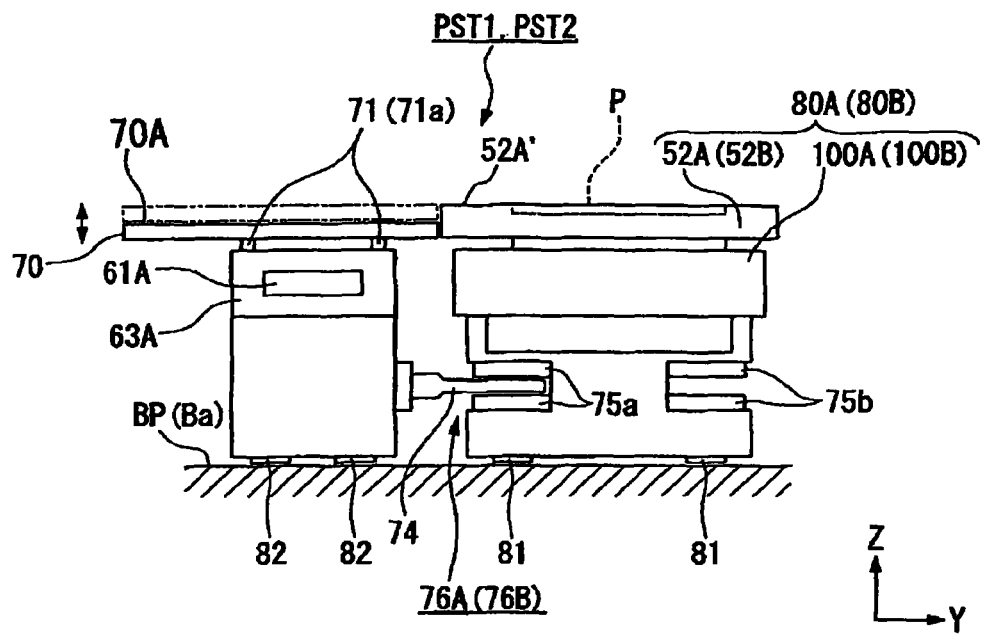
FIG. 6 is a schematic plan view of the substrate stage that comprises the stage apparatus.

FIG. 6 is a front view of substrate stage PST1 (PST2).

Note that the configuration of the substrate stages PST1, PST2 is similar, so only substrate stage PST1 will be explained below, and, with respect to substrate stage PST2, only the reference symbols (mainly, the character B is additionally noted) will be noted in the drawing.

As shown in FIG. 6, substrate stage PST1 comprises X coarse movement stage (second moving apparatus) 63A discussed above and a table part 80A provided with respect to this X coarse movement stage so that it can be freely exchanged. A plurality of vacuum pre-load air bearings 82, which are non-contact bearings, are provided on the bottom surface of the coarse movement stage 63A, and they are such that the coarse movement stage 63A is supported without contact above the movement plane Ba, which is the upper surface of the base plate BP, with a clearance of approximately several microns by means of the static pressure of the pressurized gas (for example, helium or nitrogen gas) blown from the bearing surfaces of the air bearings 82 and the balance between the dead weight of the entire coarse movement stage 63A and the vacuum suction force.

The table part 80A comprises a substrate table (first moving table) 52A, which holds the substrate P, and a fine movement stage (first moving apparatus) 100A, which holds the substrate table 52A by means of a Z tilt drive mechanism. The Z tilt drive mechanism comprises, for example, voice coil motor stators arranged on the fine movement stage 100A at the apex position of a nearly equilateral triangle and three voice coil motor movers arranged at the bottom surface of the substrate table 52A to correspond to these stators, and, through these three voice coil motors, the substrate table 52A can be driven by a slight amount more than the drive amount of the substrate table 52A resulting from X coarse movement stage 63A with respect to the directions with three degrees of freedom of the Z axis direction, the θx direction (direction of rotation about the X axis), and the θy direction (direction of rotation about the X axis).

A plurality of vacuum pre-load type air bearings 81, which are non-contact bearings, are provided on the bottom surface of the fine movement stage 100A, and they are such that the table part 80A is supported without contact above the movement plane Ba, which is the upper surface of the base plate BP, with a clearance of approximately several microns by means of the static pressure of the pressurized gas (for example, helium or nitrogen gas) blown from the bearing surfaces of the air bearings 81 and a balance between the dead weight of the entire table part 80A and the vacuum suction force.

The substrate P is secured to the upper surface of the substrate table 52A via a holder that is not shown in the drawing by means of electrostatic suction or vacuum suction. The substrate table 52A is such that liquid repellence treatment such as fluorine resin coating is performed on the upper surface, and it has liquid repellency with respect to the liquid 1.

At both sides of the Y axis direction of the fine movement stage 100A, magnets 75a, 75a and 75b, 75b are mutually arranged in the Z direction leaving intervals with identical positions in the Z direction. In addition, a stator 74, which has a built-in armature unit, is provided in a protruding manner at a position interposed between magnets 75a, 75a and 75b, 75b. The gap between these magnets 75a, 75a and the gap between magnets 75b, 75b are such that the position in the Z direction is set to be the same as the aforementioned stators 74, the side that opposes the stators 74 is opened, and it is symmetrical (in FIG. 6, right-left symmetry) in relation to the Y direction. In addition, the fine movement stage 100A, which is equipped with magnets 75a, 75b, comprises stators 74 along with an X linear motor 76A as the movers, and it performs fine movement in the X axis direction through driving by means of electromagnetic interaction with the stators 74. Note that, though not shown in the drawing, the fine movement stage 100A has a configuration such that it is constrained so that it is only able to move within a prescribed movement range in relation to the X axis direction by means of a drive apparatus such as a voice coil motor, and it moves in an unrestrained status in a direction that moves away from X coarse movement stage 63A in relation to the Y axis direction. Specifically, the fine movement stage 100A has a freely attachable and removable configuration such that it performs fine movement with respect to X coarse movement stage 63A for at least the X direction and the Y direction while separating from X coarse movement stage 63A by moving in the Y direction, in which there is movement away from X coarse movement stage 63A, and conversely connecting to X coarse movement stage 63A by moving in an approaching direction.

Also, provided on X coarse movement stage 63A is a moving table (second moving table) 70 (an additional code has not been added, since it is not provided on X coarse movement stage 63B and is only provided on X coarse movement stage 63A), which moves in the Z direction so that it is positioned at a position that opposes the liquid immersion region AR2 when the substrate table 52A has moved to a position (second position) in which it has separated from the exposure position K1 that opposes the liquid immersion region AR2. The moving table 70 is formed of the material that has the same liquid repellency as the substrate table 52A, and it is able to move freely in the Z axis direction by means of the driving of the raising and lowering apparatus 71. In addition, the moving table 70 is formed to a size such that all locations oppose the liquid immersion region AR2 when X coarse movement stage 63A has moved on the base plate BP due to a table part 80A, 80B exchange sequence, etc. and when the substrate table 52 has moved away from a position that opposes the liquid immersion region AR2.

The raising and lowering apparatus 71 has a configuration such that, by means of the cylinder 71a connected to the moving table 70 extending in the Z direction under the control of the control apparatus CONT, it raises and lowers the moving table 70 between a position (the position shown by the solid line in FIG. 6) aligned with the substrate table 52A leaving a slight gap and a lay-by position (position shown by the alternate long and short dashed line in FIG. 6) below the measuring beams BA, BB discussed below with the surface 70A thereof being approximately flush with the flat surface 52A' of the substrate table 52A. This slight gap is set to approximately several μm to several mm, for example, and the liquid 1 is restricted from leaking out via the slight gap by means of the surface tension of the liquid 1.

The position of the wafer stage, which is positioned in the exposure area A, in the Y axis direction is measured by a laser interferometer 32, which directs a measuring beam BA to the side surface of the –Y side of the substrate table 52A (or 52B), and the position in the X axis direction is measured by a laser interferometer 33, which directs a measuring beam to the side surface of the –X side of the substrate table 52A, and the results thereof are output to the control apparatus CONT. In the present embodiment as well, in the same way as in the first embodiment, the thickness of the substrate table 52A (52B) is set to a size at Which irradiation of the measuring beam BA to the substrate table 52A can be maintained and position measurement can be continued even when the measuring beam BA of laser interferometer 32 has been crossed during raising and lowering.

In addition, the position of the substrate stage, which is positioned in the measuring area AL, in the Y axis direction is measured by a laser interferometer 34, which is provided at approximately the center of the base plate BP and directs a measuring beam BB to the side surface of the –Y side of the substrate table 52B (or 52A), and the position in the X axis direction is measured by a laser interferometer 35, which directs a measuring beam to the side surface of the –X side of the substrate table 52B, and the results thereof are output to the control apparatus CONT.

Figure 7:
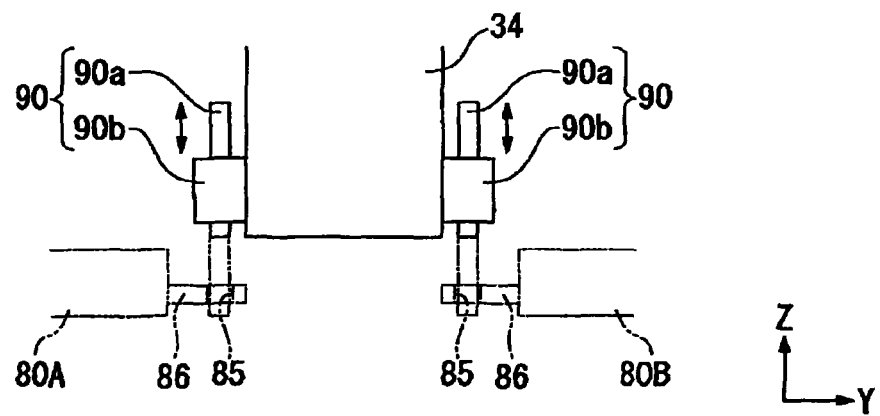
FIG. 7 is a drawing that shows lock mechanisms that lock the table parts.

As shown in FIG. 7, provided on the body of laser interferometer 34 are lock mechanisms 90, which lock (hold) the table parts 80A, 80B (fine movement stages 100A, 100B) on both sides of the X axis direction. The lock mechanisms 90 comprise shaft members 90a, which are arranged along the Z axis direction, and electromagnetic solenoid type actuators 90b for example, which drive these shaft members 90a in the Z axis direction under the control of the control apparatus CONT. On the respective sides, shaft members 90a are arranged at the same pitch as the two hole parts 85, 85 of brackets 86 provided on the table parts 80A, 80B (fine movement stages 100A, 100B), and when they have descended, they engage with the hole parts 85, 85 to position (secure) the table parts 80A, 80B at an exchange position discussed below.

Next, switching (exchange) of the table parts during operation of the stage apparatus ST relating to the present embodiment will be explained while referring to FIG. 5 and FIG. 8 to FIG. 12.

Note that, in these drawings, reference symbols are assigned only to items related to the operations explained using the respective drawings.

FIG. 5 is a drawing in which exposure processing is performed on a substrate stage PST1 (table part 80A) positioned in the exposure area A.

At this time, the liquid immersion region AR2 is formed on table part 80A (or the substrate P) positioned at the exposure position K1, and the liquid does not leak out.

Figure 8:
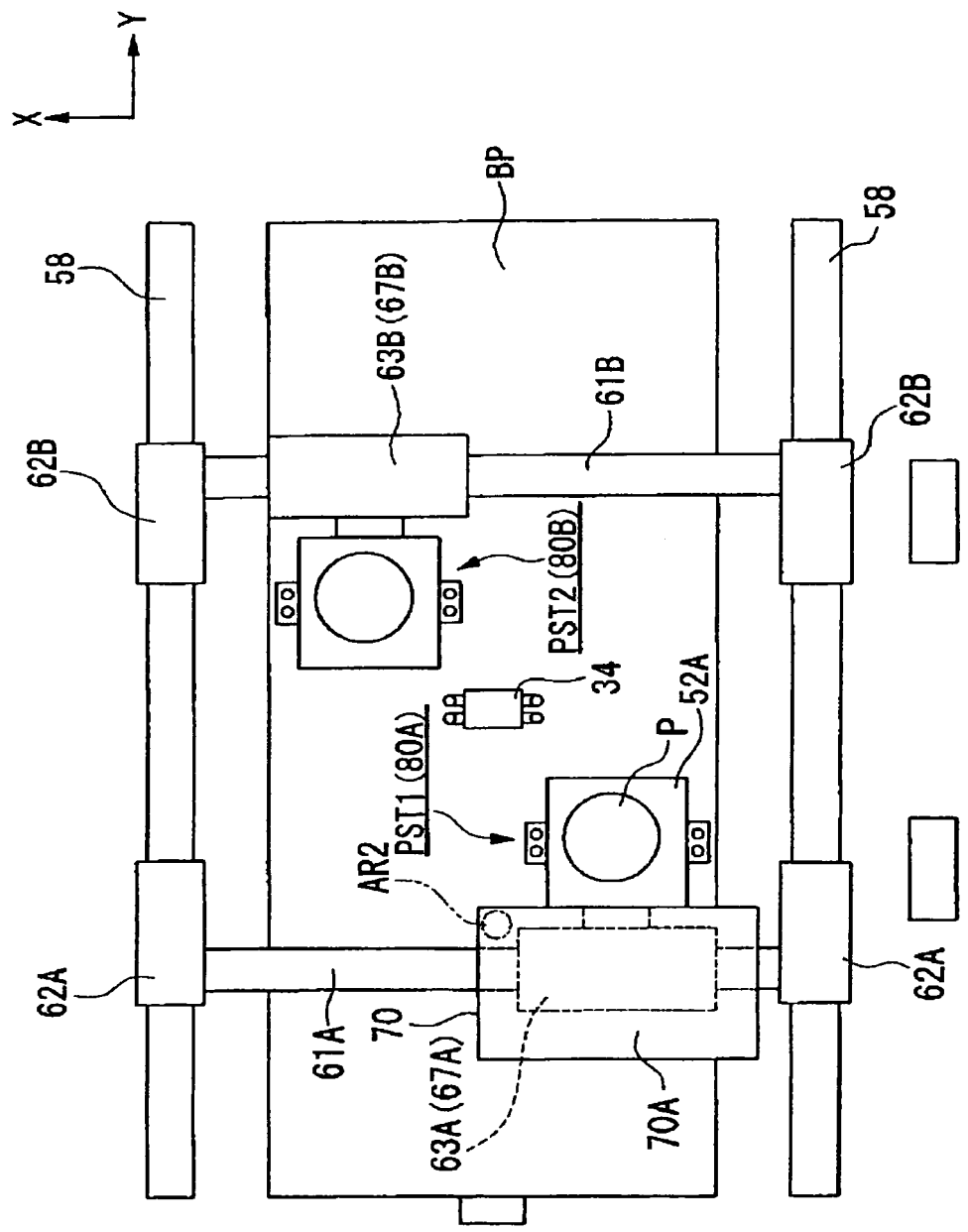
FIG. 8 is a drawing that shows the table part exchange operation.

Then, when exposure processing with respect to the substrate stage PST1 positioned in the exposure area A ends while measurement processing with respect to the substrate stage PST2 positioned in the measuring area AL ends, as shown in FIG. 8, X coarse movement stage 63A is moved along X guide stage 61A to the –X axis side end portion, and X coarse movement stage 63B is moved along X guide stage 61B to the +X axis side end portion.

At this time, since the liquid immersion region AR2 opposes surface 70A at the +X side and +Y side corner portions of the moving table 70, the liquid immersion region AR2 is maintained without the liquid flowing out. In addition, in a process in which substrate stage PST1 has moved from the exposure position K1 shown in FIG. 5 to the exchange standby position shown in FIG. 8, before the liquid immersion region AR2 moves onto moving table 70 from on the substrate table 52A, the control apparatus CONT moves the moving table 70 to a height at which surface 70A becomes approximately flush with the flat surface 52A' of the substrate table 52A as shown by the alternate long and short dashed lines in FIG. 6 by driving the raising and lowering apparatus 71 and raising the cylinder 71a. Therefore, the liquid immersion region AR2 formed on the flat surface 52A' of the substrate table 52A is able to move smoothly onto surface 70A of the moving table 70. Note that, the liquid immersion region AR2 spans the substrate table 52A and the moving table 70, but the gap between these is slight, so the fact that the liquid does not leak out due to surface tension is similar to the first embodiment above.

Figure 9:
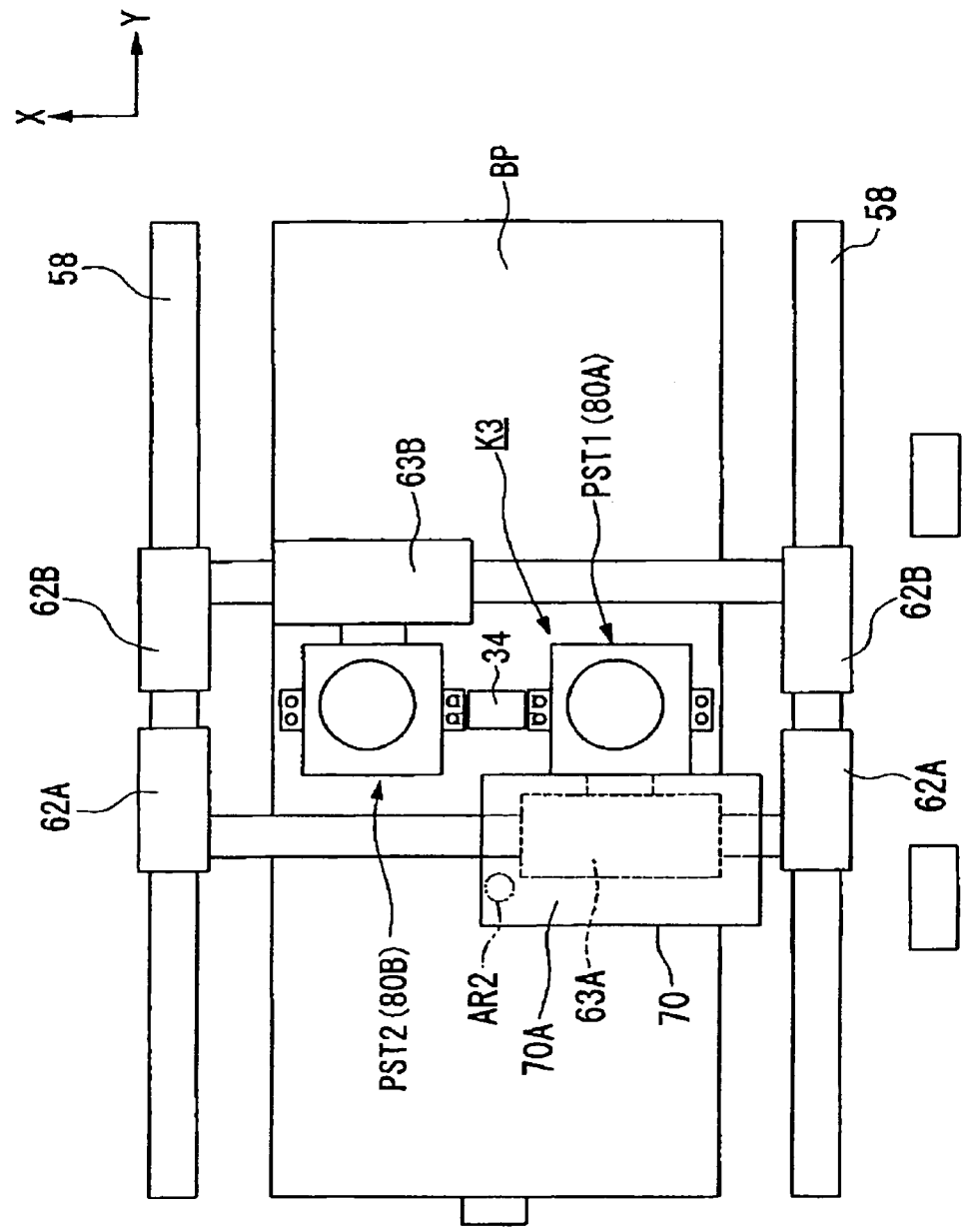
FIG. 9 is a drawing that shows the table part exchange operation.

Next, the movers 62A, 62B are respectively moved forward (in a direction in which they approach each other) along the stators 58, and, as shown in FIG. 9, the substrate stages PST1, PST2 are moved to the table part exchange position (second position) K3 where the table parts 80A, 80B are positioned at the sides (both sides of the X direction) of interferometer 34. Then, as shown in FIG. 7, the actuators 90b of the lock mechanisms 90 are driven to lower shaft members 90a. Through this, as shown by the alternate long and short dashed lines, the shaft members 90a engage with the hole parts 85 of the brackets 86, and the table parts 80A, 80B are locked at the table part exchange position K3.

When table part 80A has been positioned at this table part exchange position K3, the liquid immersion region AR2 opposes the surface 70A at the +X side and –Y side corner portions of the moving table 70, so the liquid immersion region AR2 is maintained without the liquid leaking out.

Figure 10:
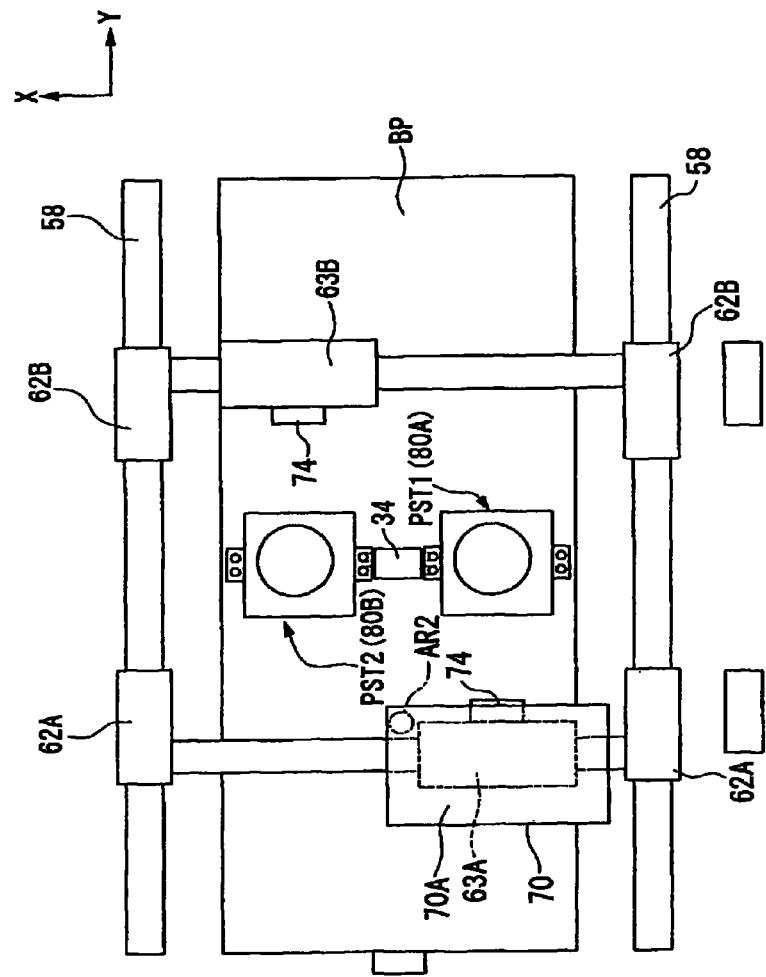
FIG. 10 is a drawing that shows the table part exchange operation.

Next, is shown in FIG. 10, the movers 62A, 62B are respectively moved backward (in a direction in which they mutually separate) along stators 58, and stator 74 is pulled out from the gap (in table part 80B, the gap between the magnets 75b, 75b) between the magnets 75a, 75a (see FIG. 6) provided on table part 80A. At this time, movers 62A, 62B are moved at a low speed for the initial several mm where stator 74 is positioned between the magnets 75a, 75a (or 75b, 75b) to increase stability, then after stator 74 has come out from the magnets 75a, 75a (or 75b, 75b), it is moved at an intermediate speed to improve throughput. When table part 80A and X coarse movement stage 63A have separated, the liquid immersion region AR2 opposes the surface 70A at the +X side and +Y side corner portions of the moving table 70, so the liquid immersion region AR2 is maintained without the liquid leaking out.

Figure 11:
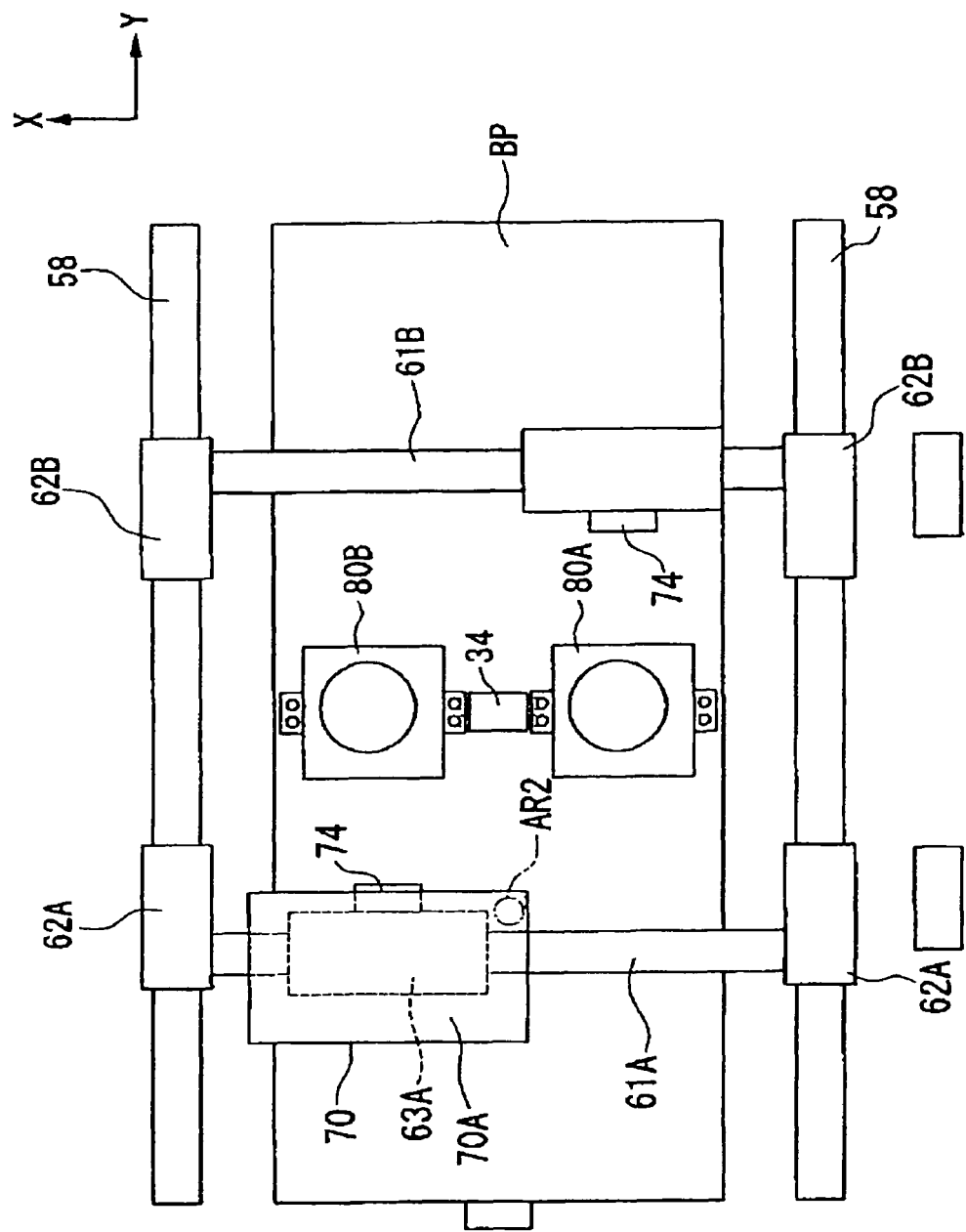
FIG. 11 is a drawing that shows the table part exchange operation.

Next, as shown in FIG. 11, X coarse movement stage 63A is moved in the +X direction along X guide stage 61A and caused to oppose table part 80B while X coarse movement stage 63B is moved in the −X direction along X guide stage 61B and caused to oppose table part 80A. At this time, the liquid immersion region AR2 opposes the surface 70A at the −X side and +Y side corner portions of the moving table 70, so liquid immersion region AR2 is maintained without the liquid leaking out.

Figure 12:
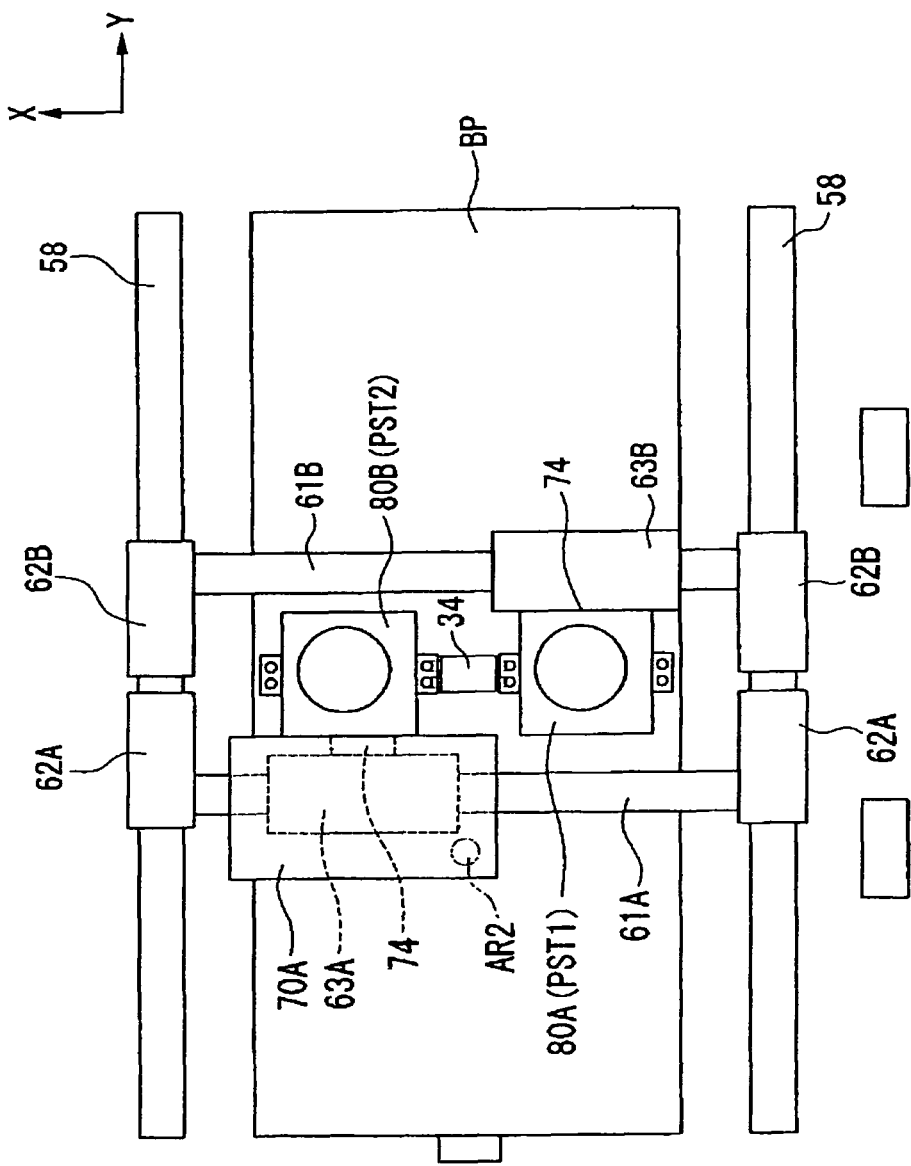
FIG. 12 is a drawing that shows the table part exchange operation.

Next, as shown in FIG. 12, the movers 62A, 62B are moved forward along stators 58 so that they approach each other, and stators 74, which are provided on the X coarse movement stages 63A, 63B, are inserted into the gaps between the magnets of the table parts 80A, 80B. In this case, stator 74 of table part 80A is inserted into the gap between magnets 75b and 75b, and stator 74 of table part 80B is inserted into the gap between magnets 75a and 75a. At this time, the liquid immersion region AR2 opposes the surface 70A at the −X side and −Y side corner portions of the moving table 70, so the liquid immersion region AR2 is maintained without the liquid leaking out.

Note that, at this time as well, movers 62A and 62B are moved at an intermediate speed until stators 74 have reached the gap between the magnets to improve throughput, and it is preferable that, for the several mm after stators 74 have reached the gaps between the magnets, the movers 62A, 62B be moved at a low speed to increase stability.

After this, the actuators 90b of the lock mechanisms 90 are driven to raise shaft members 90a. Through this, as shown by the solid line in FIG. 7, shaft members 90a separate from the hole parts 85 of the brackets 86, and locking with respect to the table parts 80A, 80B is released. Next, by moving the movers 62A, 62B backward along the stators 58, switching (exchange) of the substrate stage (table part) is completed. Then, by moving X coarse movement stage 63A along X guide stage 61A and positioning table part 80B at the exposure position K1, in which the liquid immersion region AR2 is formed in an opposing status, exposure processing with respect to the substrate held by the substrate table 52B of table part 80B is performed.

At this time, after the liquid immersion region AR2 has moved onto the substrate table 52B from on the moving table 70, the control apparatus CONT moves the moving table 70 to the lay-by position as shown by the solid line in FIG. 6 by driving the raising and lowering apparatus 71 and lowering the cylinder 71a.

In this type of stage apparatus ST, two substrate stages PST1, PST2 are independently moved in a two-dimensional direction while parallel processing of switching (exchange) of the table parts 80A, 80B discussed above, an exposure sequence with respect to a substrate on the substrate stage of the exposure area A, and a substrate exchange and alignment sequence with respect to a substrate on the substrate stage of the measuring area AL is repeatedly performed.

In this way, in the present embodiment, in the case in which a double stage system in which a plurality of substrate stages PST1, PST2 are exchanged while performing exposure processing and measurement processing in parallel is adopted, even in the case where the table part has moved away from the exposure position K1, due to the moving table 70, the liquid immersion region AR2 can be maintained without the liquid 1 leaking out, so it is possible to perform stage exchange and substrate exchange without stopping liquid supply to the liquid immersion region AR2 and liquid recovery, and it is possible to improve throughput.

Note that, in the second embodiment discussed above, a configuration in which the moving table 70 is provided on X coarse movement stage 63A was used, but it is not limited to this, and in the same way as in the first embodiment, it may also be a configuration in which moving tables 70 are respectively provided on each of the table parts 80A, 80B (specifically, a substrate table and a moving table may be respectively plurally provided). In this case, in a table part positioned in the exposure area A, when the substrate table moves away from the exposure position, the moving table 70 may be positioned at the exposure position (at a position that opposes the liquid immersion region AR2 and that is nearly flush with the upper surface of the substrate table).

Third Embodiment

Figure 14:
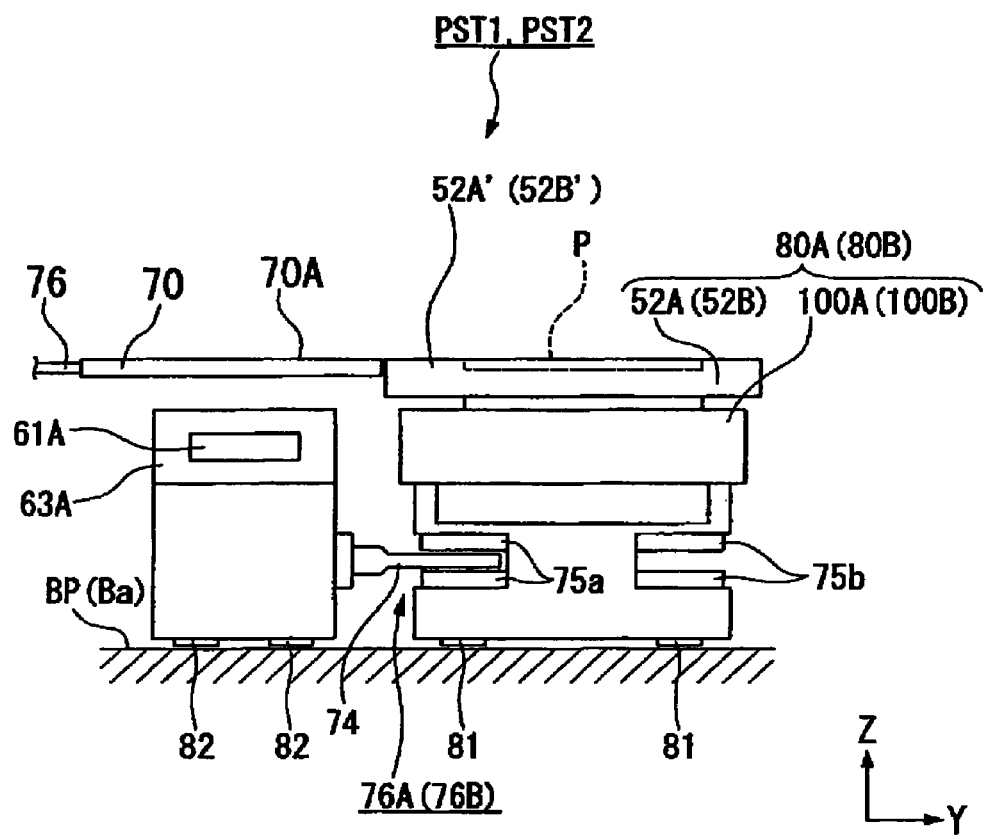
FIG. 14 is a schematic plan view of the substrate stage that comprises the stage apparatus.
Figure 15:
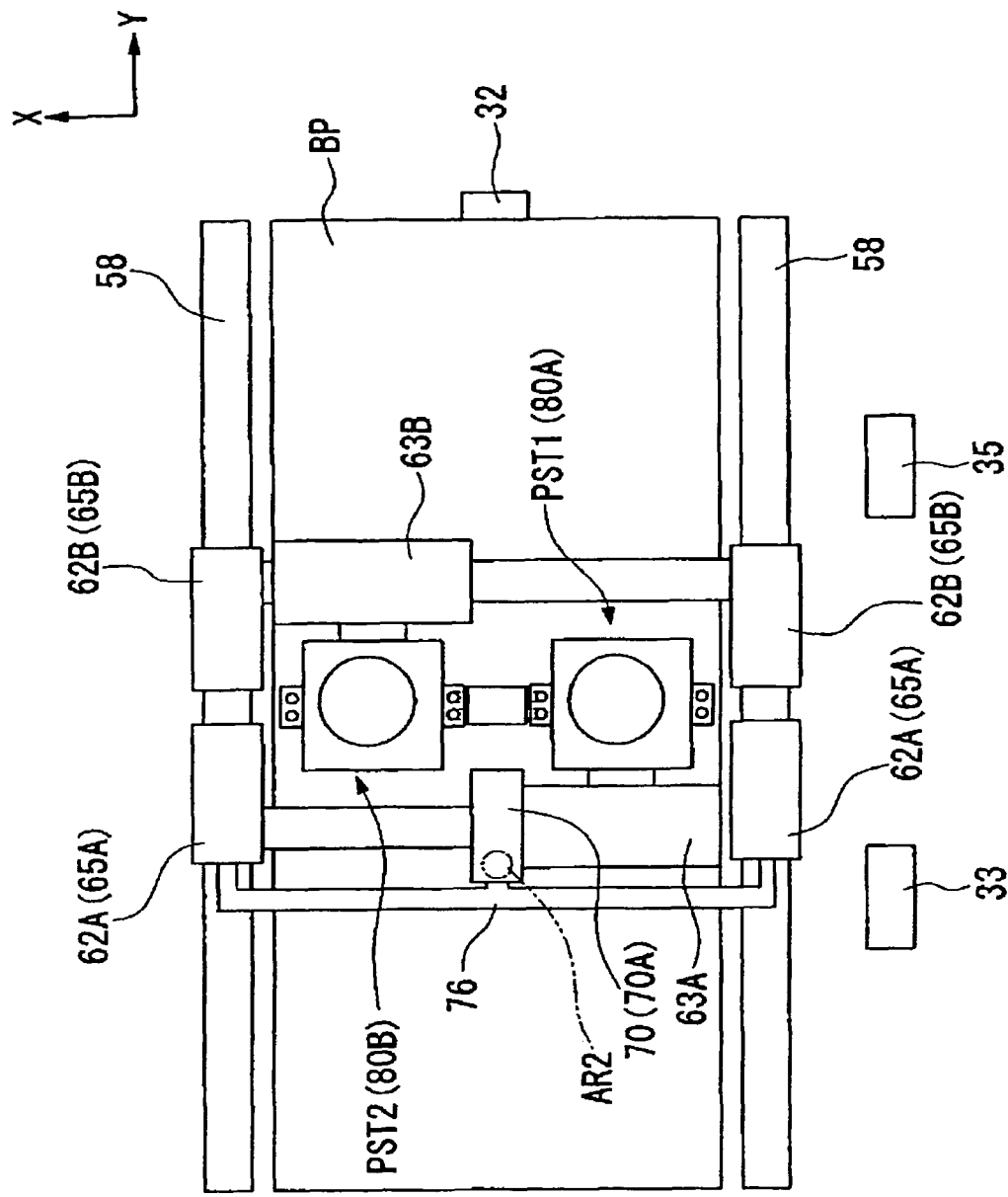
FIG. 15 is a drawing that explains the table part exchange operation.

Next, a third embodiment of the stage apparatus ST will be explained while referring to FIG. 13 to FIG. 15. In these figures, reference symbols are assigned to elements that are identical to the constituent elements of the second embodiment shown in FIG. 5 to FIG. 12, and explanations thereof will be omitted or abbreviated.

In the above second embodiment, in a double stage type stage apparatus, a configuration such that a moving table is provided on X coarse movement stage 63A was used, but, in the present embodiment, the configuration is such that the moving table 70 is linked with movers 62A of a Y linear motor 65A that drive the substrate table 52A with a larger stroke than that of the fine movement stage 100A.

Figure 13:
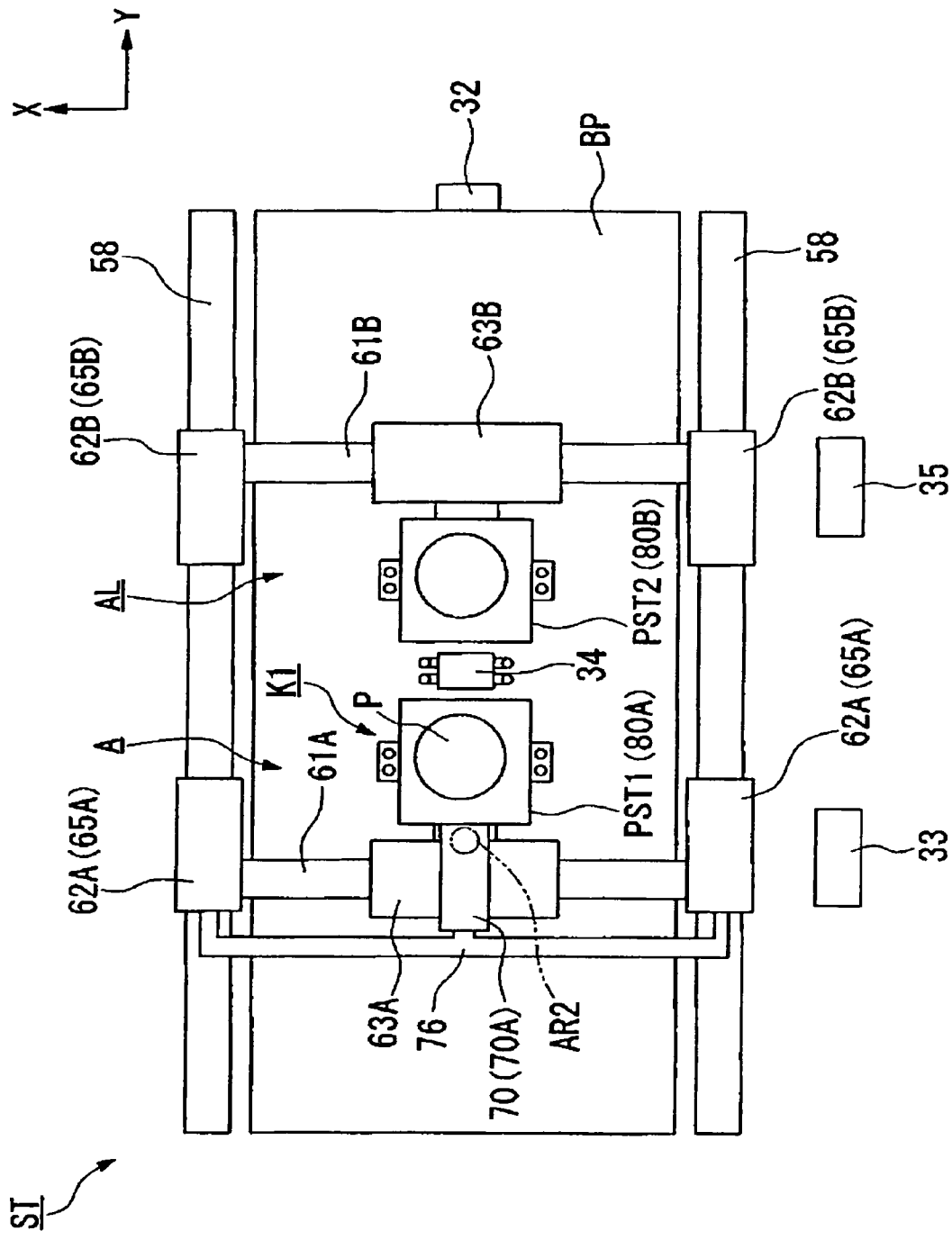
FIG. 13 is a plan view that schematically shows a stage apparatus of the third embodiment.

Specifically, in the present embodiment, as shown in FIG. 13, a stay 76, which extends in the X direction, is suspended in a horizontal direction between a pair of movers (second moving apparatuses) 62A, 62A that comprise the Y linear motor 65A. The moving table 70 extends out to the +Y side from the stay 76 with the position in the X axis direction being identical to that of the liquid immersion region AR2. The moving table 70 is formed of the material that has liquid repellency identical to that of the substrate table 52A, and, as shown in FIG. 14, is arranged at a position at which it is aligned with substrate table 52A (or 52B) leaving a slight gap through which liquid does not leak out when it is at a height at which the surface 70A becomes approximately flush with the upper surface 52A' (or 52B') of the substrate table 52A (or 52B) and the table parts 80A, 80B have linked with stators 74 (X coarse movement stage 63A).

In addition, the moving table 70 is arranged at a height at which it does not come into contact with the X coarse movement stage 63A when the X coarse movement stage 63A has moved in the X axis direction along X guide stage 61A. Moreover, the moving table 70, as shown in FIG. 15, is formed at a size at which the surface 70A opposes the liquid immersion region AR2 even during exchange of the table parts, in which movers 62A move to the extreme +Y side.

Note that, in the present embodiment, the moving table 70 is always at the same height as the substrate tables 52A, 52B, so the position of the substrate table positioned in the exposure area A is measured by laser interferometer 34, and the position of the substrate table positioned in the measuring area AL is measured by laser interferometer 32 provided at the +Y side end portion L of the base plate BP. Note that it is not necessary for the moving table 70 to always be set at the same height as 52A and 52B, and, as in the embodiments discussed above, the moving table 70 may also be driven along the Z direction.

Another configuration is similar to the above second embodiment.

In the present embodiment, in the same way as the above second embodiment, even in the case in which the table part has moved away from the exposure position K1, due to the moving table 70, the liquid immersion region AR2 can be maintained without the liquid 1 leaking out, so it is possible to perform stage exchange and substrate exchange without stopping liquid supply to the liquid immersion region AR2 and liquid recovery, and it is possible to improve throughput. In addition, in the present embodiment, it is not a configuration in which a drive mechanism for moving the moving table 70 is separately provided, so it is able to contribute to cost reductions. In addition, it is also possible to easily attach the moving table 70 to existing stage apparatuses as well.

Note that, in the above embodiments, configurations in which a moving table, instead of a substrate table, forms the liquid immersion region AR2 during liquid immersion exposure were explained, but it is not limited to these, and, for example, it is possible to use a configuration in which measurement processing is performed when the moving table has moved to the measuring position when a type of mark for position measurement has been installed on the moving table and the substrate table has moved away from the measuring position on the base plate BP.

In addition, in the above second embodiment, a configuration in which stators 58 were jointly used by the Y linear motors 65A, 65B was used, but even a configuration in which stators are individually provided would be permissible.

Moreover, in the above first and second embodiments, on the moving table 70 after the liquid immersion region AR2 has been formed, it is possible that a liquid (liquid drops) will adhere to surface 70A, and scattering will occur due to the shock during driving of the XY stage 53 and X coarse movement stage 63A. For this reason, it may also be a configuration in which air is blown onto the moving table 70 that has been lowered by driving of the raising and lowering apparatus 71 to remove the liquid or the moving table is tilted at an angle during lowering to cause the liquid to fall off under its own weight.

Moreover, in the above embodiments, a configuration was used in which the substrate stages PST1, PST2 (table parts 80A, 80B) were movably supported by a common base plate BP, but it is also possible to adopt a two base plate format in which they are respectively held on separate base plates.

In addition, in the above embodiments, a configuration was used in which the stage apparatus of the present invention was applied to a substrate stage, but it is also possible to apply it to a mask stage MST.

In addition, in the above embodiments, the case in which, during performing of exposure using one mask pattern on one of the substrate stages, substrate exchange alignment, etc. were performed on the other substrate stage was explained, but it is not limited to this, and, for example, as shown in Japanese Unexamined Patent Application Publication No. H10-214783, it is also possible to make it so that a mask stage that is able to load two masks is used to perform double exposure on one of the substrate stages using two mask patterns while substrate exchange, alignment etc. are performed in parallel on the other substrate stage. When this is done, it is possible to obtain the effects of high resolution and improved DOF (depth of focus) through double exposure without reducing throughput very much by simultaneous parallel processing.

As described above, in the present embodiment, when ArF excimer laser light has been used as the exposure light, pure water is supplied as the liquid for liquid immersion exposure. Pure water has advantages in that it can be easily obtained in large quantity at semiconductor fabrication plants, etc. and in that it has no adverse effects on the photoresist on the substrate (wafer) or on the optical elements (lenses), etc. In addition, pure water has no adverse effects on the environment and contains very few impurities, so one can also expect an action whereby the surface of the substrate and the surface of the optical element provided on the front end surface of the projection optical system are cleaned.

In addition, the index of refraction n of pure water (water) with respect to exposure light EL with a wavelength of approximately 193 nm is nearly 1.44, so in the case where ArF excimer laser light (193 nm wavelength) is used as the light source of the exposure light EL, on the substrate P, it is possible to shorten the wavelength to 1/n, that is, approximately 134 nm, to obtain high resolution. Also, the depth of focus is expanded by approximately n times, that is approximately 1.44 times, compared with it being in air, so in the case where it would be permissible to ensure the same level of depth of focus as the case in which it is used in air, it is possible to further increase the numerical aperture of the projection optical system PL, and resolution improves on this point as well.

In addition, it is also possible to use a liquid 1 that has transmittivity with respect to the exposure light, whose refractive index is as high as possible, and that is stable with respect to the photoresist that is coated onto the projection optical system PL and the surface of the substrate P.

If $F_2$ laser light is used as the exposure light, a fluorine group liquid, for example, a fluorocarbon oil or a perfluoropolyether (PFPE), that is able to transmit $F_2$ laser light should be used as the liquid.

Note that, when a liquid immersion method such as that discussed above is used, the numerical aperture NA of the projection optical system PL may at times become 0.9 to 1.3. In this way, in the case in which the numerical aperture NA of the projection optical system PL becomes larger, image formation characteristics may deteriorate due to a polarization effect with the random polarized light conventionally used as the exposure light, so it is preferable that polarized light illumination be used. In that case, linear polarization illumination to match the lengthwise direction of the line pattern of the line and space pattern of the mask (reticle) is performed, and refracted light of the S polarization component (TE polarization component), that is, the polarization direction component along the lengthwise direction of the line pattern, may be irradiated from the mask (reticle) pattern in large quantities. In the case in which the space between the projection optical system PL and the resist coated onto the surface of the substrate P is filled with a liquid, the transmittivity of the refracted light of the S polarization component (TE polarization component) at the resist surface, which contributes to the improvement of contrast, is higher than that of the case in which the space between the projection optical system PL and the resist coated onto the surface of the substrate P is filled with air (gas), so high image formation performance can be obtained even in such cases as when the numerical aperture NA of the projection optical system exceeds 1.0. In addition, it is even more effective when a phase shift mask or a grazing incidence illumination method (particularly, the dipole illumination method) matching the lengthwise direction of the line pattern such as that disclosed in Japanese Unexamined Patent Application Publication No. H6-188169 is appropriately combined.

In addition, for example, in the case where an ArF excimer laser is used as the exposure light, and a projection optical system PL with a reduction rate of approximately ¼ is used to expose a fine line and space pattern (for example, an L/S of approximately 25 to 50 nm) on the substrate P, depending on the structure of the mask M (for example, the degree of fineness of the pattern and the thickness of the chrome), the mask M acts as a polarization plate due to the wave guide effect, and more refracted light of the S polarization component (TE polarization component) emerges from the mask M than refracted light of the P polarization component (TM polarization component), which reduces contrast. In this case as well, it is preferable that the linear polarization illumination discussed above be used, but even if the mask M were illuminated by random polarized light, it would be possible to obtain high resolution performance using a projection optical system in which the numerical aperture NA becomes large at 0.9 to 1.3. In addition, in a case such as one where an extremely fine line and space pattern on the mask M is exposed onto the substrate P, there is a possibility that the P polarization component (TM polarization component) will be larger than the S polarization component (TE polarization component) due to the wave guide effect, but, for example, if the conditions are such that ArF excimer laser light is used as the exposure light, and a projection optical system with a reduction rate of approximately ¼ is used to expose a line and space pattern larger than 25 nm on the substrate P, more refracted light of the S polarization component (TE polarization component) will emerge from the mask than refracted light of the P polarization component (TM polarization component), so it would be possible to obtain high resolution performance even in the case in which the numerical aperture NA of the projection optical system becomes large at 0.9 to 1.3.

In addition, as disclosed in Japanese Unexamined Patent Application Publication No. H6-53120, not only linear polarization illumination (S polarization illumination) that matches the lengthwise direction of the line pattern of the mask (reticle) but a combination of a polarization illumination method that linearly polarizes in the circular connection (circumferential) direction centering on the optical axis and the grazing incidence method is also effective. In particular, in the case where not only a line pattern in which the pattern of the mask (reticle) extends in one prescribed direction but a line pattern that extends in a plurality of different directions are intermingled, as disclosed in the same Japanese Unexamined Patent Application Publication No. H6-53120, by jointly using a polarization illumination method that linearly polarizes in the circular connection direction centering on the optical axis and the annular illumination method, it is possible to obtain high resolution performance even in the case in which the numerical aperture NA of the projection optical system is large.

Note that, applicable as the substrate P of the aforementioned respective embodiments are not only a semiconductor wafer for the manufacture of semiconductor devices but glass substrates for display devices, ceramic wafers for thin film magnetic heads, or mask or reticle base plates, etc. (synthetic quartz, silicon wafer) used in exposure apparatuses.

Applicable as the exposure apparatus EX are, in addition to step and scan system scanning exposure apparatuses (scanning steppers) that synchronously move the mask M and the substrate P and scan expose the pattern of a mask M, step and repeat system projection exposure apparatuses (steppers) that full-field expose the pattern on the mask M in a status in which the mask M and the substrate P have been made stationary and sequentially step move the substrate P. In addition, the present invention is also applicable to step and stitch system exposure apparatuses that partially superpose and transfer at least two patterns on the substrate P.

In addition, in the embodiments discussed above, a scanning type exposure apparatus (scanner) that has a catadioptric system with a magnification of ¼ was used as an example of a liquid immersion exposure apparatus, but it is not limited to this. For example, a liquid immersion stepper that has a refraction system with a magnification of ⅛ (total refraction system) may also be used. In the case of a magnification of ⅛, it is no longer possible to full-field expose chips with large areas, so a stitching system should be employed for chips with large areas.

The types of exposure apparatuses EX are not limited to exposure apparatuses for semiconductor element manufacture that expose a semiconductor element pattern onto a substrate P but are also widely applicable to exposure apparatuses for the manufacture of liquid crystal display elements and for the manufacture of displays, and exposure apparatuses for the manufacture of thin film magnetic heads, image pickup elements (CCD) or reticles or masks.

In the case where a linear motor is used in the substrate stage PST or the mask stage MST (see U.S. Pat. No. 5,623,853 or U.S. Pat. No. 5,528,118), an air floating type that uses air bearings or a magnetic levitation type that uses Lorentz's force or reactance force may be used. In addition, the respective stages PST, MST may be the types that move along a guide or may be the guideless type in which a guide is not provided.

For the drive mechanisms of the respective stages PST, MST, a planar motor that places in opposition a magnet unit that two-dimensionally arranges magnets and an armature unit that arranges coils two-dimensionally and drives the respective stages PST, MST by electromagnetic force may be used. In such a case, either the magnet unit or the armature unit is connected to the stage PST, MST, and the other from among the magnet unit and the armature unit may be provided on the moving surface side of the stage PST, MST.

The reaction force generated by the movement of the substrate stage PST may be caused to mechanically escape to the floor (ground) using a frame member so that it is not transmitted to the projection optical system PL as described in Japanese Unexamined Patent Application Publication No. H8-166475 (U.S. Pat. No. 5,528,118).

The reaction force generated by the movement of the mask stage MST may be caused to mechanically escape to the floor (ground) using a frame member so that it is not transmitted to the projection optical system PL as described in Japanese Unexamined Patent Application Publication No. H8-330224 (U.S. Pat. No. 5,874,820).

The exposure apparatus EX of the embodiment is manufactured by assembling various subsystems, including the respective constituent elements, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly of the various subsystems to the exposure apparatus has ended, overall adjustment is performed, and the various precisions are ensured for the exposure apparatus as a whole. Note that it is preferable that the manufacture of the exposure apparatus be performed in a clean room in which the temperature, the degree of cleanliness, etc. are controlled.

Figure 16:
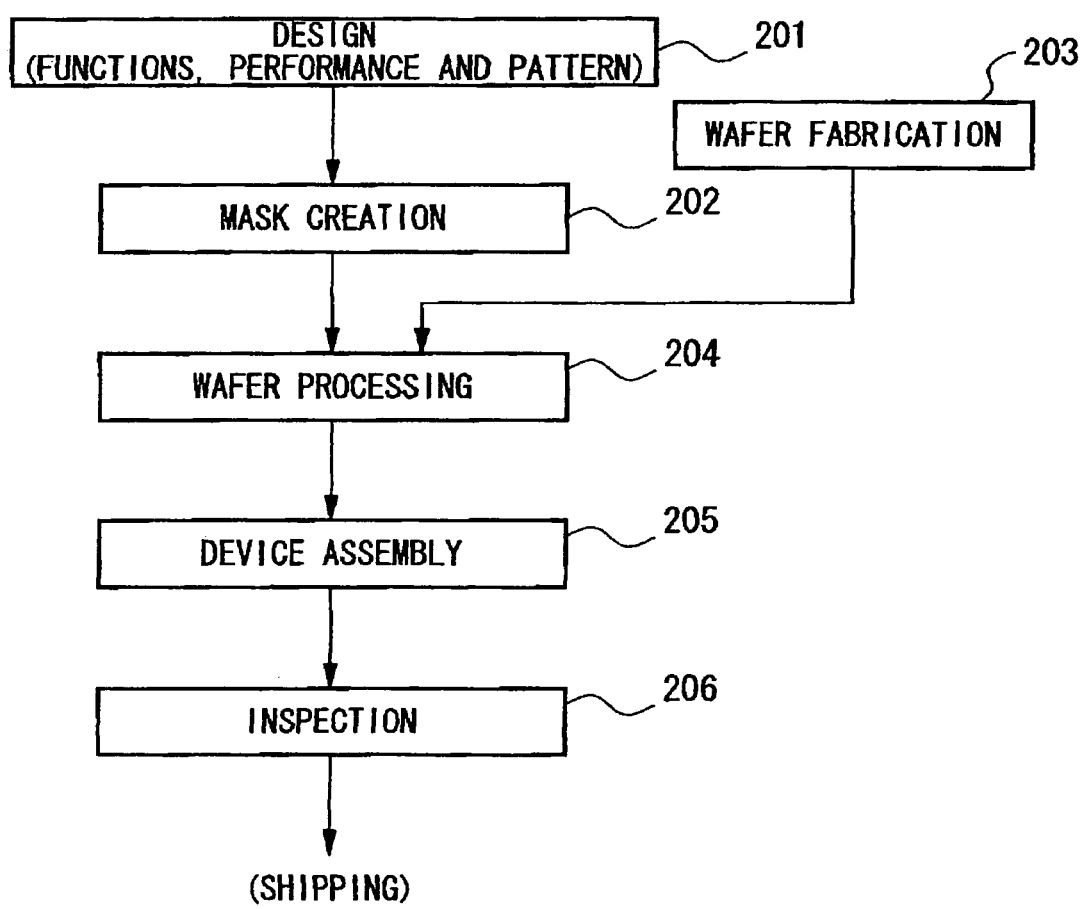
FIG. 16 is a flow chart that shows an example of the semiconductor device fabrication process.

As shown in FIG. 16, microdevices such as semiconductor devices are manufactured by going through a step 201 that performs microdevice function and performance design, a step 202 that creates the mask (reticle) based on this design step, a step 203 that manufactures the substrate that is the device base material, a substrate processing step 204 that exposes the pattern on the mask onto a substrate by means of the exposure apparatus EX of the embodiment discussed above, a device assembly step (including the dicing process, bonding process and packaging process) 205, an inspection step 206, etc.

What is claimed is:

1. An exposure apparatus that irradiates a substrate, which is loaded from outside, with exposure light to form a pattern on the substrate, the exposure apparatus comprising:
    an optical member from which the exposure light exits;
    first and second movable members that are each configured to move with respect to the optical member independently from each other while holding the substrate;
    a liquid supply device configured to supply a liquid to a space between the substrate and the optical member to form a liquid immersion, the substrate being held by the first movable member or the second movable member;
    a third movable member having no mechanism for holding the substrate, the third movable member being positioned at a position at which the exposure light is irradiated when the first and the second movable members are away from the position;
    a first moving device configured to move the first movable member in a first direction;
    a second moving device configured to move the second movable member in the first direction;
    a third moving device configured to move the first movable member in a second direction, the second direction intersecting the first direction; and
    a fourth moving device configured to move the second movable member in the second direction, wherein
    each of the first and the second moving devices has a movement stroke that is larger than a movement stroke of the third or the fourth moving device,
    the movement stroke of the third or the fourth moving device is larger than a size of the substrate, and
    the third movable member is connected to the first moving device or the second moving device.

2. The exposure apparatus according to claim 1, wherein
    at least a part of the first and the second moving devices includes a stator and a mover that cooperates with the stator, and
    the stator is jointly used in the first and the second moving devices.

3. The exposure apparatus according to claim 1, wherein
    the first moving device has a first mover, and the second moving device has a second mover,
    the third moving device moves the first movable member with respect to the first mover, and
    the fourth moving device moves the second movable member with respect to the second mover.

4. The exposure apparatus according to claim 1, wherein the liquid immersion can move from the first movable member to the second movable member via the third movable member.

5. A device fabricating method that includes a lithographic process, the lithographic process comprising forming a device pattern on a substrate using the exposure apparatus according to claim 1.

6. The exposure apparatus according to claim 1, wherein the third movable member is directly connected to the first moving device or the second moving device.

7. The exposure apparatus according to claim 1, wherein the third movable member is separate from the third moving device and the fourth moving device.

8. The exposure apparatus according to claim 1, wherein the third moving device and the fourth moving device are each configured to move independently of the third movable member.

9. The exposure apparatus according to claim 1, further comprising:
    a connecting member via which the third movable member is connected to the first moving device or the second moving device, the connecting member being different than any part of the third and fourth moving devices.

10. The exposure apparatus according to claim 1, wherein the third movable member is connected to the first moving device or the second moving device such that the third movable member is fixed in the second direction relative to the first moving device and the second moving device.

11. The exposure apparatus according to claim 1, wherein the third movable member is not connected to either the third moving device or the fourth moving device.

12. An exposure method for irradiating a substrate, which is loaded from outside, with exposure light to form a pattern on the substrate, the method comprising:
    providing a first moving device to move a first movable member in a first direction;
    providing a second moving device to move a second movable member in the first direction;
    providing a third moving device to move the first movable member in a second direction, the second direction intersecting the first direction;
    providing a fourth moving device to move the second movable member in the second direction;
    irradiating the exposure light from an optical member;
    moving the first or the second movable member with respect to the optical member while the first or second movable member holds the substrate, the first and second movable members being configured to move with respect to the optical member independently from each other while holding the substrate;
    supplying a liquid to a space between the substrate and the optical member to form a liquid immersion, the substrate being held by the first movable member or the second movable member; and
    moving the liquid immersion from the first movable member to the second movable member via a third movable member, the third movable member having no mechanism for holding the substrate and the third movable member being positioned at a position at which the exposure light is irradiated when the first and the second movable members are away from the position, wherein
    each of the first and the second moving devices has a movement stroke that is larger than a movement stroke of the third or the fourth moving device, the movement stroke of the third or the fourth moving device is larger than a size of the substrate, and the third movable member is connected to the first moving device or the second moving device.

13. The exposure method according to claim 12, wherein the third movable member is directly connected to the first moving device or the second moving device.

14. The exposure method according to claim 12, wherein the third movable member is separate from the third moving device and the fourth moving device.

15. The exposure method according to claim 12, wherein the third moving device and the fourth moving device are each configured to move independently of the third movable member.

16. The exposure method according to claim 12, further comprising:

providing a connecting member via which the third movable member is connected to the first moving device or the second moving device, the connecting member being different than any part of the third and fourth moving devices.

17. The exposure method according to claim 12, wherein the third movable member is connected to the first moving device or the second moving device such that the third movable member is fixed in the second direction relative to the first moving device and the second moving device.

18. The exposure method according to claim 12, wherein the third movable member is not connected to either the third moving device or the fourth moving device.

* * * * *